(12) United States Patent
Ogura

(10) Patent No.: US 6,542,039 B1
(45) Date of Patent: Apr. 1, 2003

(54) PHASE-LOCKED LOOP APPARATUS AND METHOD

(75) Inventor: Youichi Ogura, Ehime (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/701,464

(22) PCT Filed: Mar. 29, 2000

(86) PCT No.: PCT/JP00/01941

§ 371 (c)(1),
(2), (4) Date: Feb. 5, 2001

(87) PCT Pub. No.: WO00/58965

PCT Pub. Date: Oct. 5, 2000

(30) Foreign Application Priority Data

Mar. 29, 1999 (JP) .......................................... 11-085749

(51) Int. Cl.[7] .............................................. H03L 7/085
(52) U.S. Cl. ........................ 331/11; 331/1 A; 375/376; 360/51
(58) Field of Search ................... 331/11, 1 A; 369/43, 369/33, 47, 60.01; 360/51; 375/376

(56) References Cited

U.S. PATENT DOCUMENTS 5,663,945 A 9/1997 Hayashi et al.
5,841,323 A * 11/1998 Fujimoto ..................... 331/11

FOREIGN PATENT DOCUMENTS

| EP | 0538867 A2 | 4/1993 |
| EP | 0618574 A2 | 10/1994 |
| JP | 59-23926 | 2/1984 |
| JP | 1-293718 | 11/1989 |
| JP | 7-21695 | 1/1995 |
| JP | 7-176145 | 7/1995 |
| JP | 9-2471347 | 9/1997 |
| JP | 10-107623 | 4/1998 |
| WO | 96/10254 | 4/1996 |

OTHER PUBLICATIONS

J. Hong et al., "An Experimental 180 MB/SEC PRML Channel for Magnetic Recording", IEEE Transactions on Magnetics, US, IEEE Inc. New York, vol. 27, No. 6, Nov. 1, 1991, pp. 4532–4537, XP000257373 ISSN: 0018–9464.

* cited by examiner

Primary Examiner—Arnold Kinkead
(74) Attorney, Agent, or Firm—Wenderoth, Lind & Ponack, L.L.P.

(57) ABSTRACT

The present invention provides a phase-locked loop apparatus which extends a capture range in clock reproduction when digital data is reproduced and performs a high-speed and stable phase locking.

A phase error is detected by a phase error detector 6 from a signal obtained by the sampling. Further, a frequency error is detected by a frequency error detector 8 on the basis of an inclination of a phase curve obtained by phase error information. A phase-locked loop circuit is controlled on the basis of these obtained phase error and frequency error.

19 Claims, 14 Drawing Sheets

Fig.15 (b) (PRIOR ART)

PHASE-LOCKED LOOP APPARATUS AND METHOD

TECHNICAL FIELD

The present invention relates to a phase-locked loop apparatus and, more particularly, to a phase-locked loop apparatus improved by digitizing a phase-locked loop which is used to reproduce a clock for reproducing digital data recorded on recording media such as optical disk media, magneto-optical disk media, and magnetic media.

BACKGROUND ART

Optical disk apparatuses are widely known as one of apparatuses for recording and reproducing digital data. In the optical disk apparatus, a phase-locked loop (PLL) circuit is conventionally used to lock a phase of a clock component included in a reproduction signal and a phase of a reproduction clock, when the digital data is reproduced. Particularly, an erasable optical disk medium has plural unit blocks called "sectors", each of which comprises a set of a header part on which address information and the like is written and a data part on which the digital data is actually recorded. The phase locking is performed sector by sector by the phase-locked loop.

In order to perform this intermittent reproduction normally, the header part and data part have locking patterns (VFO patterns) 42a–42d, as shown in FIG. 19, each of which comprises a single pattern (single frequency). The data reproduction is performed using a method of increasing the response characteristic of the phase-locked loop circuit to perform high-speed and stable phase locking in these VFO pattern areas, and decreasing the response characteristic of the phase-locked loop circuit before ends of the VFO pattern areas to reduce influences of noises and the like, thereby to maintain a locked state.

FIG. 19 is a diagram showing a data format in a sector of an optical disk reproduction apparatus. In the figure, reference numeral 43 designates a sector mark (hereinafter referred to as SM) indicating a start position of the sector. Numeral 44 designates an address mark (hereinafter referred to as AM) indicating a start position of address information. Numeral 45 designates address information (hereinafter referred to as ID) indicating the address of the sector. Numeral 46 designates a postamble (hereinafter referred to as PA) indicating an end point of each of the header part and the data part. Numeral 47 designates a data mark (hereinafter referred to as DM) indicating a start position of data 48.

FIG. 20 is a block diagram illustrating a digital data reproduction circuit of a prior art optical disk reproduction apparatus.

The prior art optical disk reproduction apparatus as shown in FIG. 20 is constituted by an optical disk 49, a reproduction means 50, a waveform equalization means 1, a binarization means 51, a phase-locked loop circuit 52, a loop gain switching unit 57, and a demodulation circuit 58. The phase-locked loop circuit 52 is constituted by a phase comparator 53, a loop filter 54, an amplifier 55, and a Voltage Controlled Oscillator (VCO) 56.

Hereinafter, its operation will be described.

On the optical disk 49 medium, digital data comprising 0 and 1, the number of continuous 0 or 1 being controlled to from 3 to 14 inclusive, is recorded as in the 8–16 modulation method for example. In a reproduction signal which is obtained by reproducing data with the reproduction means 50, as the recording density of the data in the linear direction is increased, the amplitude of a waveform having high-band frequency components is attenuated by interference. Then, the waveform equalization means 1 corrects the reproduction signal so as to emphasize its high-band frequency components. The binarization means 51 binarizes the reproduction signal having the emphasized high-band frequency components at a prescribed slice level to convert the signal into a binarized digital signal. In the phase-locked loop circuit 52, a phase of a reproduction clock as a free running frequency of the phase-locked loop circuit 52 and a phase of a clock component of the binarized signal are compared by the phase comparator 53, and the phase of the reproduction clock is changed on the basis of phase error information which is output as a result of the comparison so as to have the minimum phase error, by using the loop filter 54, the amplifier 55 and the VCO 56, whereby the phase of the clock component of the binarized signal and the phase of the reproduction clock are locked. The response characteristic of the phase-locked loop circuit 52 is switched by the loop gain switching unit 57. Then, the binarized signal and the locked reproduction clock are input to the demodulation circuit 58 to demodulate the digital data.

In the VFO pattern areas on the recording medium, a range where the reproduction is normally performed is sometimes limited due to defects of the recording medium, servo processing or signal processing in the reproduction of the recording medium. Accordingly, improvements are made to perform the phase locking surely as in a method of detecting the defects or the method as shown in FIG. 19 of detecting SM 43, AM 44, and DM 47 to make the best use of all the VFO pattern areas.

The above-mentioned prior art is adapted to a method which binarizes the reproduction signal to demodulate the digital data. However, when a signal-to-noise ratio of the reproduction signal is significantly deteriorated as the density in the linear direction is increased, the quality of reproduced data is deteriorated.

Accordingly, as the recording density in the linear direction becomes higher, a PRML (Partial Response Maximum Likelihood) signal processing method as a signal processing method which is suitable for the high-density recording and reproduction in the linear direction is increasingly adopted. The PRML signal processing method is the one which urges intentional waveform interference for the reproduction signal, equalizes the reproduction signal with a band which is controlled to reduce emphasis on noises to the utmost, and thereafter demodulates data by a maximum likelihood decoder for demodulating the most likelihood series in accordance with a known regulation of interference. However, when this PRML signal processing method is utilized, multi-bit data obtained by sampling a reproduction clock which is locked to a phase of a clock component included in the reproduction signal should be generated.

This prior art phase-locked loop circuit is constituted by analog elements. Accordingly, a system where analog circuits and digital circuits are mixed in a complex manner is obtained and this system is not suitable for the integration. In addition, the dispersion of characteristics caused by the analog elements constituting the analog circuits or secular changes occur in the analog circuits. Accordingly, careful consideration should be given also to the quality control, compensation circuits and the like, whereby the cost of the digital data reproduction apparatus which is constituted by using the phase-locked loop circuit is increased.

Therefore, a system which is suitable for the PRML signal processing should be realized by digitizing also a clock reproduction circuit and equalization means, thereby increasing the quality of reproduced data and reducing the cost by the integration also in the high-density recording and reproduction.

However, when the phase-locked loop circuit for performing the clock reproduction is realized by digital circuits, as a transfer rate is increased, a delay amount of the phase-locked loop is increased and a capture range indicating a range where a frequency and a phase can be locked at the phase locking is reduced. When phase error information is obtained from analog signals, an amount of a continuous time error can be handled. However, when the phase error information is obtained from digital data after the sampling, the phase error information should be assumed from an amplitude value in the vicinity of a zero cross point. Therefore, sufficient continuous areas of phase error signals cannot be secured.

When the capture range is reduced, in a case where the frequency of the reproduction clock is significantly different from the frequency of the clock component included in the reproduction signal, the phase locking is not completed only by the VFO pattern areas. Therefore, errors such as burst errors are increased at the reproduction time and thereby the data quality is deteriorated.

In addition, the VFO pattern areas are small and, in the case of erasable disks, there is an increase in a risk that the first half part of that area is deteriorated as the number of writing times is increased or a DC offset position is substantially shifted. Therefore, when the frequency of the reproduction clock is significantly different from the frequency of the clock component included in the reproduction signal, errors such as burst errors at the reproduction time are increased and the quality of data is deteriorated.

Further, when data recorded on the recording medium does not include the VFO pattern, the reproduction signal is a random signal. Therefore, when the phase locking is performed using only the phase information, the capture range in locking the phase of the clock component of the reproduction signal and the phase of the reproduction clock is reduced. Accordingly, when both frequencies are significantly different from each other, the phase locking cannot be performed surely.

The present invention is directed to solve the above problems, and an object of the present invention is to provide a phase-locked loop apparatus: which detects phase information from a reproduction signal as well as detects frequency information from a temporal change of the phase information, has a wider capture range than that of an analog phase-locked loop circuit, and performs the phase locking at a high speed, when a phase-locked loop circuit is digitized.

In addition, an object of the present invention is to provide a phase-locked loop apparatus which predicts phase error information to obtain a wider capture range, as well as locks the phase of the reproduction clock and the phase of the clock component included in the reproduction digital signal at a high speed and with good stability, when the phase-locked loop circuit is digitized.

Further, in addition to the above objects, the present invention has another object to provide a phase-locked loop apparatus which can perform the phase locking also for digital data having no pattern signal comprising a single frequency in a data format of digital information which is recorded on a recording medium.

Furthermore, in addition to the above objects, another object of the present invention is to provide a low cost phase-locked loop apparatus which can be integrated easily and has higher reliability.

SUMMARY OF THE INVENTION

To solve the above problems, according to first aspect of the present invention, a phase locked loop apparatus which reads digital data recorded on a recording medium in a predetermined data format, and generates a reproduction clock for obtaining a reproduction digital signal, comprises: a phase error information detection means for detecting phase error information from a signal area other than a single frequency data area comprising a single frequency in the data format; a frequency error information detection means for detecting frequency error information from the single frequency data area comprising the single frequency in the data format; and a feedback loop for locking a phase of the reproduction clock and a phase of a clock component included in the reproduction digital signal, on the basis of the phase error information and the frequency error information, whereby a phase-locked loop circuit is digitized.

According to the present invention, clock reproduction which is suitable for a PRML signal processing method can be performed. In addition, when a multi-bit digital signal which is obtained by the sampling by the A/D converter is a VFO pattern signal, a phase error signal and a frequency error signal are input to the feedback loop as input signals. Therefore, in a VFO pattern area, even when a reproduction signal includes DC components, the phase error is detected correctly, whereby the VFO pattern area can be effectively utilized. Further, a frequency error detector detects a correct inclination of a phase error curve. Therefore, a capture range is substantially extended, whereby a phase-locked loop apparatus which can perform the phase locking at a high speed and with good stability even when a frequency of a reproduction clock is significantly different from a frequency of a clock component included in the reproduction signal can be provided.

According to a second aspect of the present invention, a phase-locked loop apparatus which reads digital data recorded on a recording medium in a predetermined data format, and generates a reproduction clock for obtaining a reproduction digital signal, comprises: a waveform equalization means for emphasizing a predetermined frequency band of a reproduction signal; an A/D conversion means for sampling the reproduction signal, the predetermined frequency band of which is emphasized by the waveform equalization means, using a reproduction clock at a time when a digital signal is reproduced, to obtain a digital signal; a high-pass filter (HPF) means for removing DC components from the digital signal obtained by the sampling when the obtained digital signal is a VFO pattern signal; a low-band component suppression means for suppressing low-band noises of the digital signal obtained by the sampling when the obtained digital signal is a signal other than the VFO pattern signal; a zero cross detection means for detecting a position where an output of the HPF means or low-band component suppression means crosses a zero level, and outputting a zero cross flag; a phase error detection means for detecting a phase error from data in the vicinity of a zero cross, using the zero cross flag and the output of the HPF means or low-band component suppression means; "n" pieces of a holding means for holding continuous "n" ("n" is a positive integer) pieces of the phase errors on the basis of the zero cross flag, which holding means are connected in series with each other; a frequency error detection means for detecting an inclination of a phase error curve from outputs of the respective "n" pieces of holding means, and converting the inclination into a frequency error; a phase controlling loop filter means for receiving a phase error signal which is an output of the phase error detection means and a frequency error signal which is an output of the frequency error detection means, as input signals when the digital signal obtained by the sampling is the VFO pattern signal, and receiving the phase error signal which is the output of the phase error detection means as an input signal when the obtained digital signal is a signal other than the VFO pattern signal; and an oscillator means for generating a reproduction clock on the basis of an output of the phase controlling loop filter means, whereby a phase-locked loop circuit is digitized.

According to the present invention, the clock reproduction which is suitable for the PRML signal processing method can be performed. In addition, when a multi-bit digital signal which is obtained by the sampling by the A/D converter is a VFO pattern signal, the phase error signal and the frequency error signal are input to the feedback loop as input signals. Therefore, in a VFO pattern area, even when a reproduction signal includes DC components, the phase error is detected correctly, whereby the VFO pattern area can be effectively utilized. Further, the frequency error detector detects a correct inclination of a phase error curve. Therefore, the capture range is substantially extended, whereby a phase-locked loop apparatus which can perform the phase locking at a high speed and with good stability even when a frequency of the reproduction clock is significantly different from a frequency of a clock component included in the reproduction signal can be provided.

According to a third aspect of the present invention, a phase-locked loop apparatus which reads digital data recorded on a recording medium in a predetermined data format, and generates a reproduction clock for obtaining a reproduction digital signal, comprises: a phase error information detection means for detecting phase error information from a random signal area in the digital data; a frequency error information detection means for detecting frequency error information from the random signal area in the digital data; and a feedback loop for locking a phase of the reproduction clock and a phase of a clock component included in the reproduction digital signal on the basis of the phase error information and the frequency error information, and a feedback loop phase controlling loop filter receives a phase error signal and a frequency error signal as input signals.

According to the present invention, when re-locking of phases is required in an area of data other than the VFO pattern because of defects of a recording medium or the like, the capture range is extended as well as the re-locking time is reduced. Therefore, deterioration in the quality of reproduced data due to burst errors or the like can be minimized. Further, a phase-locked loop apparatus which can obtain the same effects as described above also in a recording medium having no VFO pattern area can be provided.

According to a fourth aspect of the present invention, a phase-locked loop apparatus which reads digital data recorded on a recording medium in a predetermined data format, and generates a reproduction clock for obtaining a reproduction digital signal, comprises: a waveform equalization means for emphasizing a predetermined frequency band of a reproduction signal; an A/D conversion means for sampling the reproduction signal, the predetermined frequency band of which is emphasized by the waveform equalization means, using a reproduction clock at a time when a digital signal is reproduced, to obtain a digital signal; a low-band component suppression means for suppressing low-band noises of the digital signal obtained by the sampling; a zero cross detection means for detecting a position where an output of the low-band component suppression means crosses a zero level, and outputting a zero cross flag; a phase error detection means for detecting a phase error from data in the vicinity of a zero cross, using the zero cross flag and the output of the low-band component suppression means; "n" pieces of a holding means for holding continuous "n" ("n" is a positive integer) pieces of the phase errors on the basis of the zero cross flag, which holding means are connected in series with each other; a frequency error detection means for detecting an inclination of a phase error curve from outputs of the respective "n" pieces of holding means, and converting the inclination into a frequency error; a phase controlling loop filter means for receiving a phase error signal which is an output of the phase error detection means and a frequency error signal which is an output of the frequency error detection means, as input signals; and an oscillator means for generating a reproduction clock on the basis of an output of the phase controlling loop filter means, and the phase controlling loop filter receives the phase error signal and the frequency signal as input signals.

According to the present invention, when the re-locking of phases is required in an area of data other than the VFO pattern because of defects of a recording medium or the like, the capture range is extended as well as the re-locking time is reduced. Therefore, deterioration in the quality of reproduced data due to burst errors or the like can be minimized. Further, a phase-locked loop apparatus which can obtain the same effects as described above also in a recording medium having no VFO pattern area can be provided.

According to a fifth aspect of the present invention, in the phase-locked loop apparatus of the second or fourth aspect, the phase error detection means comprises: a first holding means and a second holding means for holding amplitudes of reproduction signals at adjacent zero cross positions for each zero cross, on the basis of the zero cross flag; a subtraction means for receiving an output of the first holding means and an output of the second holding means as inputs; a polarity decision means for deciding whether a reproduction waveform at a timing when the amplitude is held by the first holding means is a leading edge or a trailing edge, on the basis of previous and subsequent data; and a sign manipulation means for manipulating a sign of an output of the subtraction means on the basis of an output of the polarity decision means.

According to the present invention, correlation of phase error information in the temporal direction is enhanced, whereby the phase error detection having resistance to high-band noise components can be performed. Therefore, a phase-locked loop apparatus which can perform the phase locking without being affected by the high-band noises as well as can maintain a locked state stably can be provided.

According to a sixth aspect of the present invention, in the phase-locked loop apparatus of the second or fourth aspect, the frequency error detection means comprises: a plural subtraction means each obtaining a difference between the phase errors output by predetermined two holding means among the "n" pieces of holding means; a polarity decision means for deciding which is a polarity of an output of each of the plural subtraction means among positive, negative, and zero; a selection means for removing information at a discontinuous point of the phase error curve on the basis of plural inclination information output by the plural subtraction means, and selecting information of an inclination where frequency information is obtained stably; a balancing means for balancing the inclination information selected by the selection means; and a gain stage for arbitrarily adjusting a gain of an output of the balancing means, and outputting the adjusted gain to the phase controlling loop filter means, and a correct frequency error is assumed using only a phase error in a linear and continuous area of the phase error curve.

According to the present invention, the capture range is extended as well as the response speed of frequency control is increased. Therefore, a phase-locked loop apparatus which can perform the phase locking at a high speed can be provided.

According to a seventh aspect of the present invention, in the phase-locked loop apparatus of the second or fourth aspects, the frequency error detection means of the sixth aspect is included and the phase controlling loop filter means comprises: a phase error absolute value conversion means for converting the output of the phase error detection means into an absolute value; a phase decision means for deciding a magnitude of the obtained absolute value with a predetermined threshold; a start time setting means for manipulating a control start time so as to start an operation of a loop filter from the vicinity of a zero phase as a stable point of the phase error curve when control is executed using the phase error signal on the basis of an output of the selection means of the frequency error detection means of the sixth aspect and an output of the phase decision means; and loop filter means for outputting a control signal for the oscillator means on the basis of an output of the start time setting means.

According to the present invention, when the frequency error detection means of the sixth aspect is utilized, a time for performing the phase locking is made equal to a case where a zero phase start is performing, i.e., the phase of the reproduction clock is adjusted so that the clock component included in the reproduction signal and the reproduction clock are in phase and then the phase locking is started. Therefore, a phase-locked loop apparatus which can perform the phase locking at the minimum time can be provided.

According to an eighth aspect of the present invention, in the phase-locked loop apparatus of the second or fourth aspect, the phase controlling loop filter means comprises: a frequency error absolute value conversion means for converting the output of the frequency error detection means into an absolute value; a frequency decision means for deciding a magnitude of the obtained absolute value with a predetermined threshold; an error selection means for performing switching on the basis of an output of the frequency decision means, so that control is executed using only the phase error signal when a frequency of the reproduction clock is within a phase locked range, and using only the frequency error signal when the frequency of the reproduction clock is outside the phase locked range; and a loop filter means for outputting a control signal for the oscillator means on the basis of an output of the error selection means.

According to the present invention, when the frequency of the reproduction clock is quite different from the frequency of the clock component included in the reproduction signal and is outside the phase locked range, the control is executed using only the frequency error signal. Therefore, relative to a case where the phase error is simultaneously fed back, the frequency locking is completed at a higher speed. On the other hand, when the frequency of the reproduction clock is within the phase locked range, the control is executed using only the phase error signal. Therefore, the phase locking is completed smoothly. Accordingly, a phase-locked loop apparatus which can execute the optimal control making the best use of respective advantages of the phase error and frequency error can be provided.

According to a ninth aspect of the present invention, a phase-locked loop apparatus which reads digital data recorded on a recording medium in a predetermined data format, and generates a reproduction clock for obtaining a reproduction digital signal, comprises: an acquisition phase error information detection means for detecting acquisition phase error information from a single frequency data area comprising a single frequency in the data format; a tracking phase error information detection means for detecting tracking phase error information from a random signal data area comprising a random signal in the digital data; and a feedback loop for locking a phase of the reproduction clock and a phase of a clock component included in the reproduction digital signal on the basis of the acquisition phase error information and the tracking phase error information.

In the present invention, in the pattern area comprising the single frequency, a correct phase error can be detected also when the reproduction signal includes DC components. Therefore, the pattern area can be utilized effectively as well as a continuous area of the phase error curve can be expanded, whereby the capture range is substantially extended. Accordingly, a phase-locked loop apparatus which can lock the phase of the reproduction clock and the phase of the clock component included in the reproduction digital data at a high speed and with good stability also when the frequency of the reproduction clock is significantly different from the frequency of the clock component included in the reproduction signal can be provided.

According to a tenth aspect of the present invention, a phase-locked loop apparatus which reads digital data recorded on a recording medium in a predetermined data format, and generates a reproduction clock for obtaining a reproduction digital signal, comprises: an A/D conversion means for sampling digital data in the data format with a reproduction clock, to obtain a digital data signal; a band-pass filter means for removing direct current components from the digital data signal obtained by the sampling, during reproduction of a single frequency data area in the data format; a zero cross detection means for detecting positions where an output signal of the band-pass filter and the digital data signal cross a zero level, and outputting respective zero cross flags; a cycle counter means for starting counting with the zero cross flag as a start point; an acquisition phase error detection means for detecting a phase error from the output signal of the band-pass filter at a timing when a timing signal is obtained by the cycle counter means, a tracking phase error detection means for detecting a phase error of the digital data signal on the basis of the zero cross flag; a loop filter means for receiving a phase error signal which is an output of the acquisition phase error detection means as an input signal when the digital signal obtained by the sampling is a VFO pattern signal, and receiving a phase error signal which is an output of the tracking phase error detection means as an input signal when the obtained digital signal is a signal other than the VFO pattern signal; a D/A conversion means for converting an output signal of the loop filter means into an analog signal; and an oscillator means for generating the reproduction clock on the basis of the analog signal output by the D/A conversion means.

In the present invention, a correct phase error can be detected in the pattern area comprising the single frequency also when the reproduction signal includes DC components. Therefore, the pattern area can be utilized effectively as well as the continuous area of the phase error curve can be expanded, whereby the capture range is substantially extended. Therefore, also when the frequency of the reproduction clock is significantly different from the frequency of the clock component included in the reproduction signal, the phase of the reproduction clock and the phase of the clock component included in the reproduction digital data can be locked at a high speed and with good stability. Further, when the phase-locked loop is digitized, the integration can be easily performed when it is realized as an IC, whereby the cost can be reduced as well as the clock reproduction which is suitable for the PRML signal processing method can be performed. Therefore, a system which is suitable for the high-density recording/reproduction can be provided.

According to an eleventh aspect of the present invention, a phase-locked loop apparatus which reads digital data recorded on a recording medium in a predetermined data format, and generates a reproduction clock for obtaining a reproduction digital signal, comprises: a first phase error information detection means for obtaining first phase error information from prediction of a zero cross position in a random signal area in the digital data; a second phase error information detection means for detecting second phase error information from a random signal in the digital data; and a feedback loop for locking a phase of the reproduction clock and a phase of a clock component included in the reproduction digital signal on the basis of the first phase error information and the second phase error information.

In the present invention, the continuous area of the phase error curve can be expanded also for digital data having no single frequency signal in data format, the capture range is substantially extended. Therefore, a phase-locked loop apparatus can be provided which can lock the phase of the reproduction clock and the phase of the clock component included in the reproduction digital data at a high speed and with good stability, as well as can reduce the re-locking time when the re-locking of phases is required because of defects of a recording medium or the like, whereby the deterioration in the quality of reproduced data due to burst errors or the like can be minimized.

According to a twelfth aspect of the present invention, a phase-locked loop apparatus which reads digital data recorded on a recording medium in a predetermined data format, and generates a reproduction clock for obtaining a reproduction digital signal, comprises: a loop gain control means for outputting a loop gain control signal for increasing a phase-locking capacity for a predetermined period from a phase-locking start; an A/D conversion means for sampling the digital data with a reproduction clock, to obtain a digital data signal; a zero cross position prediction means for predicting a zero cross position of random data in the digital data signal obtained by the sampling; an acquisition phase error detection means for detecting phase error information of the random data, from an output signal of the zero cross position prediction means and the digital data signal; a zero cross detection means for detecting a position where the obtained digital data signal crosses a zero level, and outputting a zero cross flag; a tracking phase error detection means for detecting a phase error of the digital data signal on the basis of the zero cross flag; a loop filter means for receiving a phase error signal which is an output of the acquisition phase error detection means as an input signal, and receiving a phase error signal which is an output of the tracking phase error detection means as an input signal; a D/A conversion means for converting an output signal of the loop filter into an analog signal; and an oscillator means for generating the reproduction clock on the basis of the analog signal output by the D/A conversion means.

According to the present invention, when the zero cross position prediction means is utilized, the continuous area of the phase error curve is expanded also for digital data having no single frequency signal in a data format, whereby the capture range is extended. Therefore, the phase of the reproduction clock and the phase of the clock component included in the reproduction digital data can be locked at a high speed and with good stability, as well as the re-locking time can be reduced when the re-locking of phases is required because of defects of a recording medium or the like, whereby the deterioration in the quality of reproduced data due to burst errors or the like can be minimized. Further, when the phase-locked loop is digitized, the integration can be performed easier when it is realized as an IC. Therefore, the cost can be reduced as well as the clock reproduction which is suitable for the PRML signal processing method can be performed, whereby a system which is suitable for high-density recording/reproduction can be provided.

BRIEF DESCRIPTION OF THE DRAWINGS

FIG. 15(a) is a diagram for explaining continuity of phase error signals in the digital phase-locked loop circuit of the third embodiment.

BEST MODE FOR CARRYING OUT THE INVENTION

Hereinafter, embodiments of the present invention will be described. The embodiments shown below are examples of the present invention. Therefore, the present invention is not limited to these embodiments.

[Embodiment 1]

Figure 1:
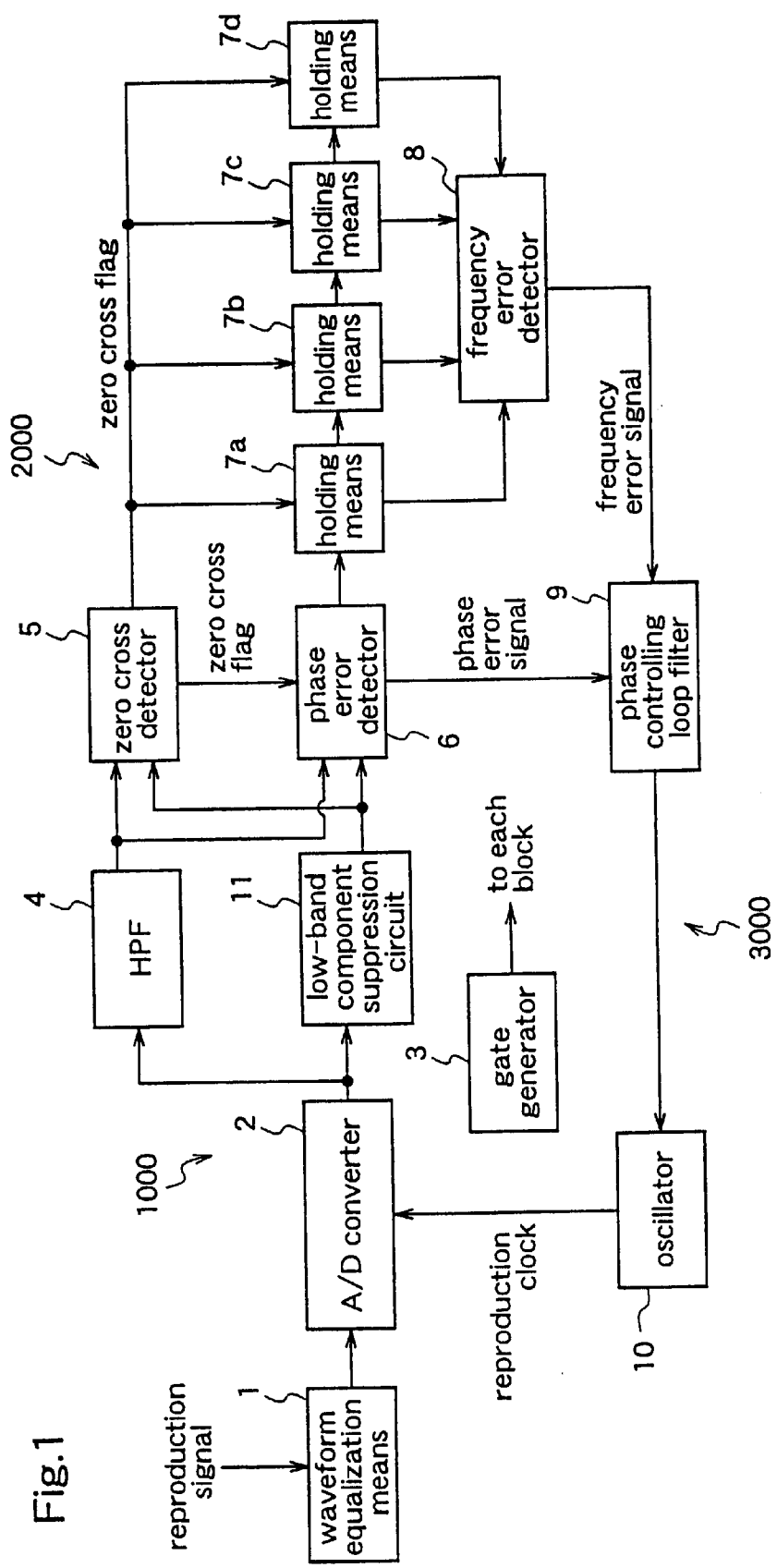
FIG. 1 is a block diagram illustrating a frequency detection type of phase-locked loop apparatus according to a first embodiment of the present invention.

FIG. 1 is a block diagram illustrating a phase-locked loop apparatus according to a first embodiment of the present invention.

As shown in FIG. 1, the frequency detection type of phase-locked loop apparatus according to the first embodiment is constituted by a waveform equalization means 1 for emphasizing high-band frequency components of a reproduction signal, an A/D converter 2 for converting an analog signal into a digital signal, a gate generator 3 for generating a gate signal, a high-pass filter (HPF) 4 for removing DC components, a zero cross detector 5 for detecting a position where a signal waveform crosses a zero level, a phase error detector 6 for detecting a phase error, holding means 7a–7d for holding the phase errors, a frequency error detector 8 for detecting a frequency error, a phase controlling loop filter 9 for locking a phase of a reproduction clock and a phase of the reproduction signal, an oscillator 10 for generating the reproduction clock, and a low-band component suppression circuit 11 for suppressing low-band noises.

A phase error information detection means 1000 for detecting phase error information from a signal area other than a single frequency data area comprising a single frequency in the data format is constituted by the waveform equalization means 1, the A/D converter 2, the low-band component suppression circuit 11, the gate generator 3, the high-pass filter (HPF) 4, the zero cross detector 5, and the phase error detector 6. A frequency error information detection means 2000 for detecting frequency error information from the single frequency data area comprising the single frequency in the data format is constituted by the waveform equalization means 1, the A/D converter 2, the low-band component suppression circuit 11, the gate generator 3, the high-pass filter (HPF) 4, the zero cross detector 5, the phase error detector 6, the holding means 7a–7d, and the frequency error detector 8. A feedback loop 3000 for locking the phase of the reproduction clock to the phase of the clock component included in the reproduction digital signal on the basis of the phase error information and the frequency error information is constituted by the phase controlling loop filter 9, the oscillator 10, and the A/D converter 2.

Hereinafter, constructions of the respective elements will be described in more detail.

Initially, the HPF 4, the phase error detector 6, the frequency error detector 8, and the phase controlling loop filter 9 are described with reference to figures.

Figure 2:
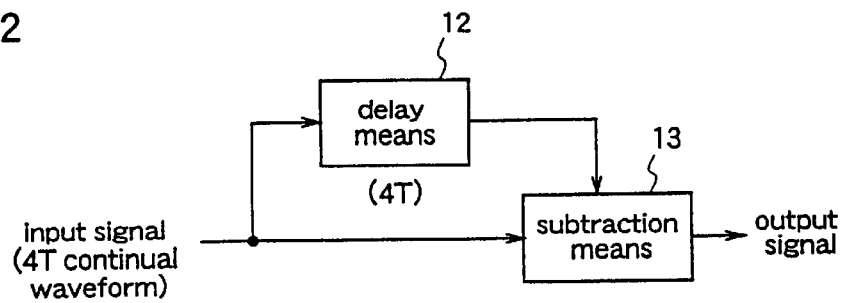
FIG. 2 is a block diagram illustrating a HPF 4 of the first embodiment.

FIG. 2 is a block diagram illustrating the HPF according to the first embodiment.

The HPF 4 according to the first embodiment is a digital filter for removing DC components in cycles of the VFO patterns, and constituted by a delay means 12 and a subtraction means 13.

For example in the case of DVD-RAM (DVD random access memory), the VFO pattern is the one in which 4T patterns (T is a minimum recording unit) are continuously repeated. In this case, as shown in FIG. 2, the delay means 12 delays an input signal (4T continual waveform) for a time corresponding to 4T and the subtraction means 13 subtracts an output of the delay means 12 from present data, thereby constructing the HPF for removing the DC components.

Figure 3:
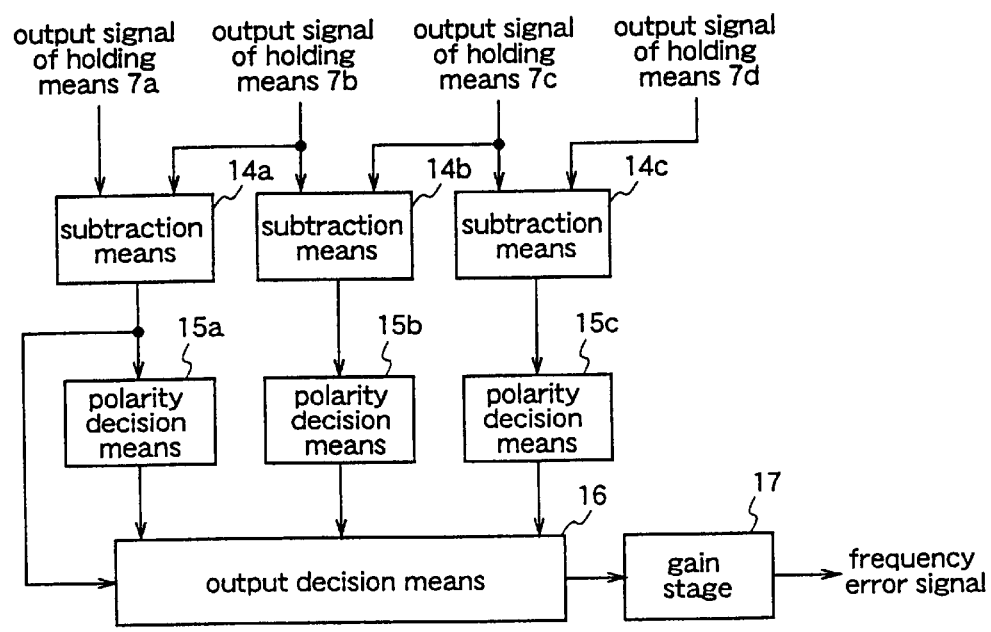
FIG. 3 is a block diagram illustrating a frequency error detector 8 of the first embodiment.

FIG. 3 is a block diagram illustrating the frequency error detector according to the first embodiment.

As shown in FIG. 3, the frequency error detector 8 of the first embodiment is constituted by a subtraction means 14a for subtracting an output of the holding means 7b from an output of the holding means 7a, a subtraction means 14b for subtracting an output of the holding means 7c from an output of the holding means 7b, a subtraction means 14c for subtracting an output of the holding means 7d from an output of the holding means 7c, polarity decision means 15a–15c for deciding which are polarities of outputs of the subtraction means 14a–14c among positive, negative and zero, an output decision means 16 for deciding whether a frequency error signal is to be output or not on the basis of outputs of the polarity decision means 15a–15c, and a gain stage 17 for adjusting a gain of the output of the subtraction means 14a only when the output decision means 16 decides that the frequency error signal is to be output, thereby outputting a frequency error signal.

Figure 4:
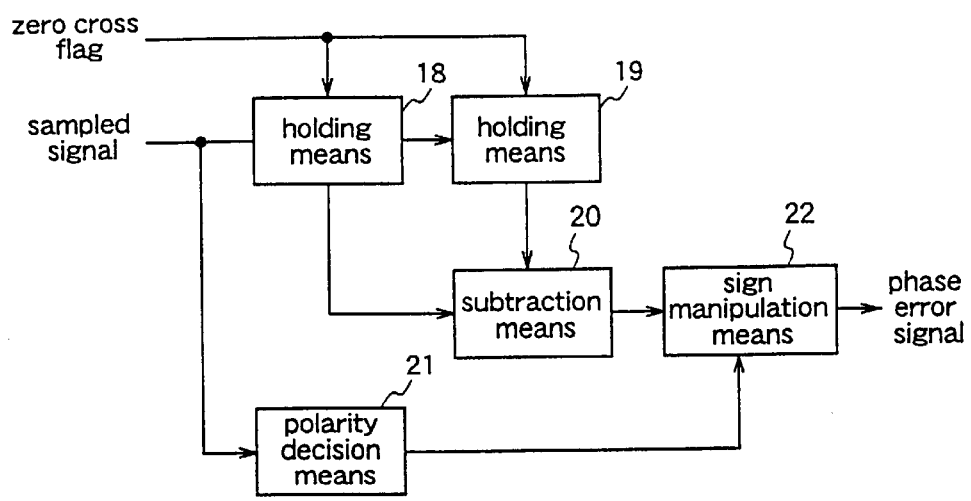
FIG. 4 is a block diagram illustrating a phase error detector 6 of the first embodiment or a second embodiment.

FIG. 4 is a block diagram illustrating the phase error detector according to the first embodiment.

As shown in FIG. 4, the phase error detector 6 of the first embodiment is constituted by holding means 18 and 19 for holding amplitudes of reproduction signals at adjacent zero cross positions for each zero cross on the basis of a zero cross flag, a subtraction means 20 for receiving outputs of the holding means 18 and 19 as input, a polarity decision means 21 for deciding whether a reproduction waveform at a timing when the amplitude is held by the holding means 18 is a leading edge or trailing edge, on the basis of previous and subsequent data, and a sign manipulation means 22 for manipulating a sign of an output of the subtraction means 20 on the basis of an output of the polarity decision means 21.

Figure 8:
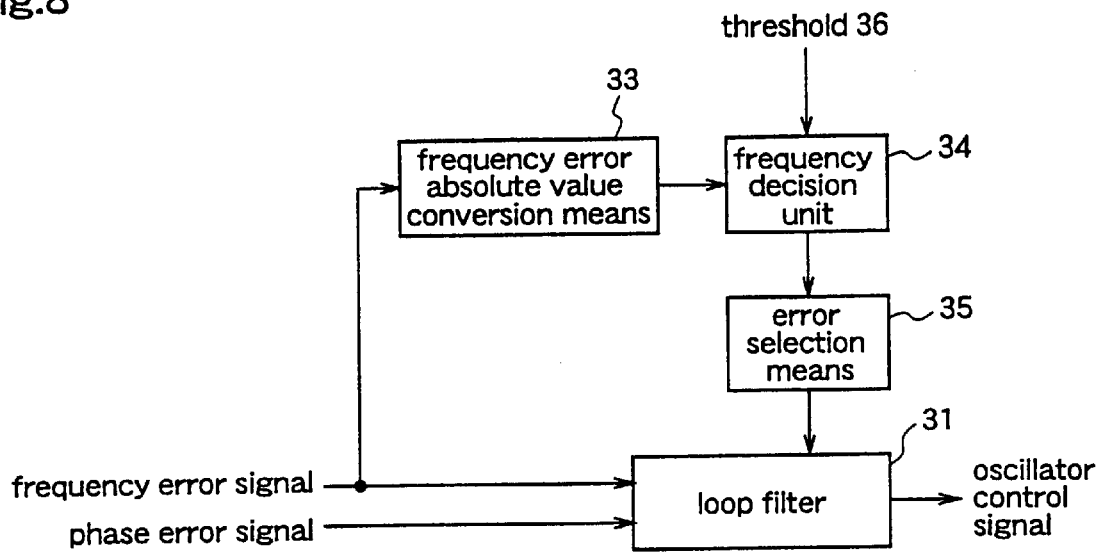
FIG. 8 is a block diagram illustrating a phase controlling loop filter 9 of the first or second embodiment.

FIG. 8 is a block diagram illustrating the phase controlling loop filter according to the first embodiment.

As shown in FIG. 8, the phase controlling loop filter 9 of the first embodiment is constituted by a frequency error absolute value conversion means 33 for converting an output of the frequency error detector 8 into an absolute value, a frequency decision unit 34 for deciding a magnitude of the obtained absolute value using a prescribed threshold 36, an error selection means 35 for outputting a selection signal to a loop filter 31 on the basis of an output of the frequency decision unit 34, so that the loop filter 31 performs control using only the frequency error signal when a frequency of a reproduction clock is outside a phase locked range, and using only the phase error signal when the frequency of the reproduction clock is within the phase locked range, and the loop filter 31 for outputting an oscillator control signal in accordance with an output of the error selection means 35.

Figure 9:
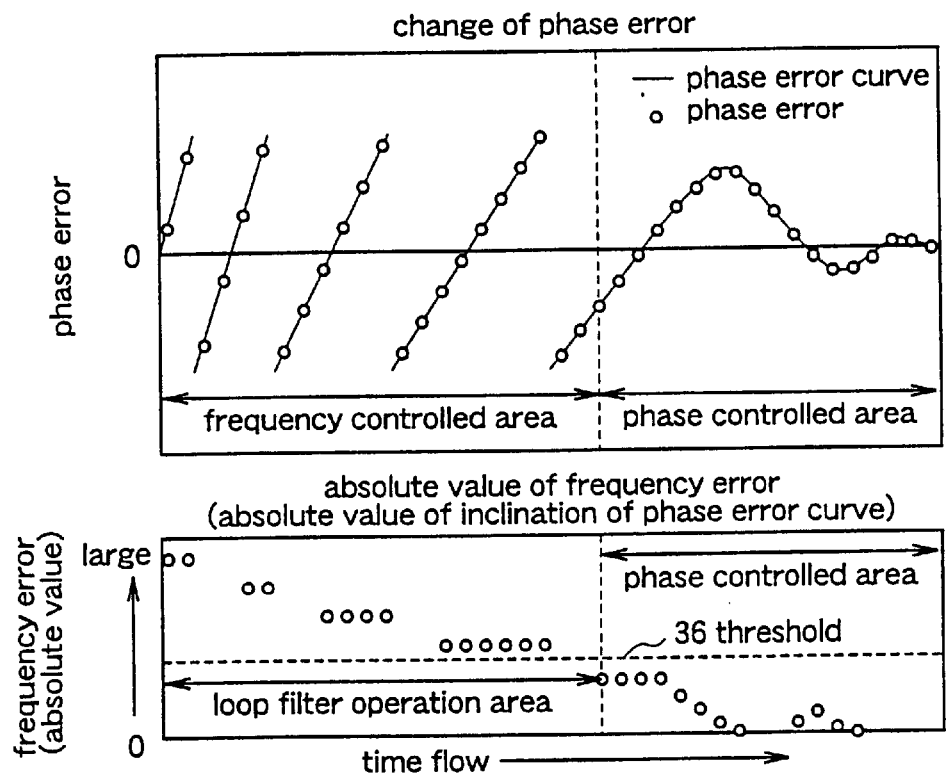
FIG. 9 is a diagram showing temporal changes of the phase error information and absolute values of frequency errors, for explaining an operation of a frequency decision unit 34 as a constituent of the phase controlling loop filter 9 of the first or second embodiment.

As shown in FIG. 9, in an area where the absolute value of the frequency error is larger than the threshold 36, the frequency decision unit 34 outputs a signal so that the error selection means 35 selects the frequency error signal. In an area where the absolute value of the frequency error is smaller than the threshold 36, the frequency decision unit 34 outputs a signal so that the error selection means 35 selects the phase error signal.

Next, the waveform equalization means 1, the A/D converter 2, the gate generator 3, the zero cross detector 5, the holding means 7a–7d, the oscillator 10, and the low-band component suppression circuit 11 will be described.

The waveform equalization means 1 is constituted by a filter such as a high-order ripple filter, which can arbitrarily set a boost amount and a cut-off frequency of the input signal.

The A/D converter 2 converts an analog signal into a multi-bit digital signal by the sampling, using a reproduction clock generated by the oscillator 10.

The gate generator 3 starts counting from the head of a sector with a counter with the reproduction clock as a reference signal, and outputs a gate signal for distinguishing between the VFO pattern area and an area of data other than the VFO pattern according to a count number at a predetermined place.

The zero-cross detector 5 detects a zero cross position as a position where a signal waveform crosses the zero level.

The holding means 7a–7d are connected in series with each other and hold continuous four phase errors.

The oscillator 10 is constituted by a VCO for controlling an oscillated frequency according to a controlled voltage. Or, it is constituted by a digital element.

The low-band component suppression circuit 11 inputs amplitude information in the vicinity of the zero cross of the reproduction signal into a low-pass filter, and subtracts obtained low-band components from the input signal considering correlation of data, thereby suppressing low-band noises.

Hereinafter, the operation will be described.

A reproduction signal from an optical disk or the like is corrected by the waveform equalization means 1 so as to emphasize high-band frequency components. Thereafter, it is sampled by the A/D converter 2 to obtain a multi-bit digital signal. Then, a gate signal indicating whether the multi-bit digital signal obtained by the sampling by the A/D converter is a VFO pattern signal or not is generated by the gate generator 3.

When the gate signal generated by the gate generator 3 indicates that the multi-bit digital signal obtained by the sampling by the A/D converter 2 is the VFO pattern signal, this multi-bit digital signal obtained by the A/D converter 2 is input to the HPF 4 and its DC components are removed. Thereafter, this signal is output to the zero cross detector 5 and the phase error detector 6.

When the digital signal whose DC components are removed by the HPF 4 is input to the zero cross detector 5, the detector 5 detects a zero cross flag as a signal indicating the zero cross position, and outputs the zero cross flag to the phase error detector 6 and the holding means 7a–7d.

When the zero cross flag output by the zero cross detector 5 and the digital signal output by the HPF 4 are input to the phase error detector 6, the detector 6 detects a phase error from data in the vicinity of the zero cross, and outputs the phase error to the holding means 7a–7d and the phase controlling loop filter 9.

The phase error output by the phase error detector 6 is held by the holding means 7a on the basis of the zero cross flag output by the zero cross detector 5. At the same time, a phase error which is held by the holding means 7a immediately before is held by the holding means 7b, a phase error which is held by the holding means 7b immediately before is held by the holding means 7c, and a phase error which is held by the holding means 7c immediately before is held by the holding means 7d.

The frequency error detector 8 detects an inclination of a phase error curve from the phase errors held by the respective holding means 7a–7d, converts the inclination into a frequency error, and output the frequency error to the phase controlling loop filter 9.

The phase controlling loop filter 9 locks the phase of the reproduction clock and the phase of the clock component included in the reproduction digital signal, using the phase error signal output by the phase error detector 6 and the frequency error signal output by the frequency error detector 8, and outputs the signal to the oscillator 10.

The oscillator 10 generates a reproduction clock on the basis of the output of the phase controlling loop filter 9, and outputs the reproduction clock to the A/D converter 2.

When the gate signal output by the gate generator 3 indicates that the multi-bit digital signal obtained by the sampling by the A/D converter 2 is data other than a VFO pattern signal, this multi-bit digital signal obtained by the A/D converter 2 is input to the low-band component suppression circuit 11 and its low-band noises are suppressed. Thereafter, this signal is output to the zero cross detector 5 and the phase error detector 6.

When the digital whose low-band noises are suppressed by the low-band component suppression circuit 11 is input to the zero cross detector 5, the detector 5 detects a zero cross flag as a signal indicating a zero cross position, and outputs the zero cross flag to the phase error detector 6 and the holding means 7a–7d.

When the zero cross flag output by the zero cross detector 5 and the digital signal output by the low-band component suppression circuit 11 are input to the phase error detector 6, the detector 6 detects a phase error from data in the vicinity of the zero cross, and outputs the phase error to the holding means 7a–7d and the phase controlling loop filter 9.

The phase controlling loop filter 9 locks the phase of the reproduction clock and the phase of the clock component included in the reproduction digital signal using the phase error signal output by the phase error detector 6, and outputs the signal to the oscillator 10.

The oscillator 10 generates a reproduction clock on the basis of the output of the phase controlling loop filter 9, and outputs the reproduction clock to the A/D converter 2.

As described above, according to the first embodiment, even when the reproduction signal includes the DC components in the VFO pattern area, a correct phase error is detected, whereby the VFO pattern area can be effectively utilized. In addition, according to this first embodiment, a correct inclination of the phase error curve is detected, whereby a capture range can be substantially extended. Therefore, even when the frequency of the reproduction clock is significantly different from the frequency of the clock component included in the reproduction signal, the phase of the reproduction clock and the phase of the clock component included in the reproduction digital data can be locked at a high speed and with good stability.

In addition, the subtraction means of the phase error detector has an effect which is equal to that of a primary low-pass filter, whereby the correlation between phase error signals in the temporal direction is enhanced. Therefore, the phase error detection has a resistant to high-band noise components. Accordingly, the phase locking can be performed without being affected by the high-band noises as well as the locked state can be maintained stably.

When the frequency of the reproduction clock is significantly different from the frequency of the clock component included in the reproduction signal and is outside the phase locked range, the phase controlling loop filter performs control using only the frequency error signal. Therefore, relative to a case where the phase error is simultaneously fed back, the frequency locking is completed at a higher speed. On the other hand, when the frequency of the reproduction clock is within the phase locked range, the phase controlling loop filter performs control using only the phase error signal. Therefore, the phase locking is smoothly completed. Accordingly, optimal control can be performed making good use of respective advantages of the phase error and the frequency error.

In this first embodiment, four holding means 7a–7d are provided. However, "n" pieces ("n" is a positive integer) of holding means connected in series can be provided. The larger the "n" is, the more correctly the phase curve can be reproduced.

In addition, in this first embodiment, the frequency error detector 8 as shown in FIG. 3 is provided. However, a frequency error detector having a structure as shown in FIG. 5 can be utilized.

Figure 5:
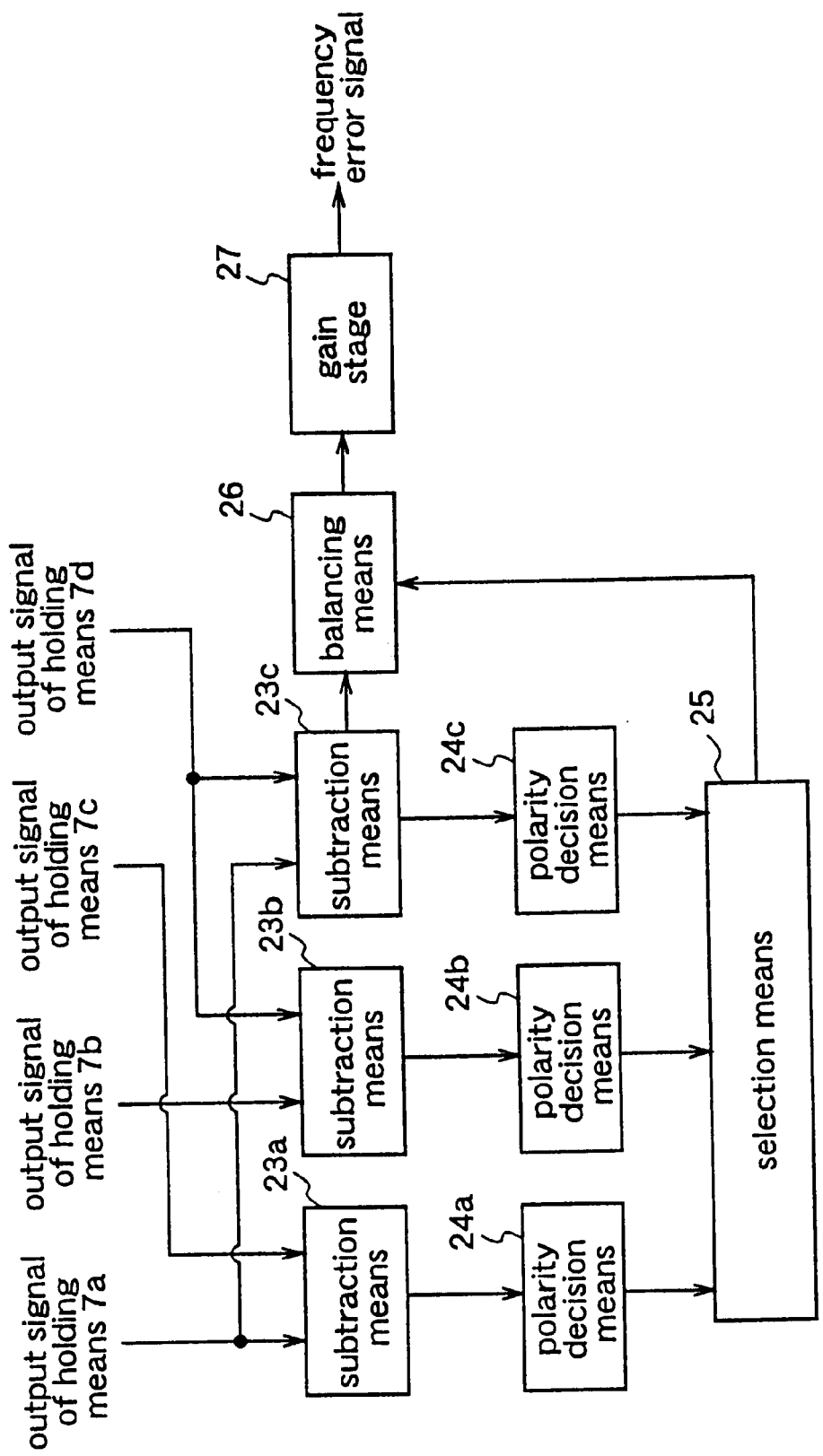
FIG. 5 is a block diagram illustrating a frequency error detector 8 of the first embodiment.

The frequency error detector as shown in FIG. 5 is constituted by a subtraction means 23a for subtracting an output of the holding means 7c from an output of the holding means 7a, a subtraction means 23b for subtracting an output of the holding means 7d from an output of the holding means 7b, a subtraction means 23c for subtracting an output of the holding means 7d from an output of the holding means 7a, polarity decision means 24a–24c for deciding which are polarities of outputs of the subtraction means 23a–23c among positive, negative and zero, a selection means 25 for removing information at a discontinuous point of the phase curve on the basis of outputs of the polarity decision means 24a–24c and selecting information of an inclination where frequency information can be stably obtained, a balancing means 26 for balancing an output of the subtraction means 23c only when the selection means 25 decides that a corresponding phase error is data of a linear and continuous area of the phase curve, and a gain stage 27 for arbitrarily adjusting a gain of an output of the balancing means 26 and outputting a frequency error signal.

Accordingly, the correct frequency error is assumed using only the phase error in the linear and continuous area of the phase curve. Therefore, the capture range is extended as well as the response speed of the frequency control is increased, whereby the phase locking can be performed at a high speed.

In addition, in this first embodiment, the phase controlling loop filter 9 as shown in FIG. 8 is provided. However, when the frequency error detector has the selection means for selecting the inclination information as the frequency error detector as shown in FIG. 5, a phase controlling loop filter having a structure as shown in FIG. 6 can be provided.

Figure 6:
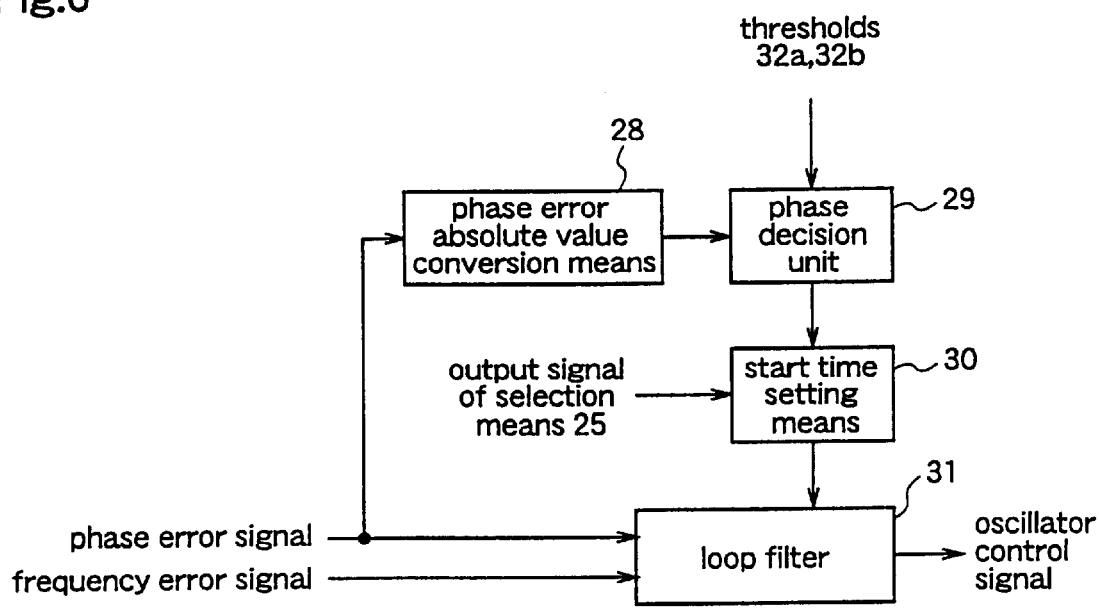
FIG. 6 is a block diagram illustrating a phase controlling loop filter 9 of the first or second embodiment.

The phase controlling loop filter as shown in FIG. 6 is constituted by a phase error absolute value conversion means 28 for converting an output of the phase error detector 6 into an absolute value, a phase decision unit 29 for deciding a magnitude of the absolute value obtained by the phase error absolute value conversion means 28, by using prescribed thresholds, a start time setting means 30 for manipulating a control start time so as to start an operation of a loop filter 31 from the vicinity of a zero phase as a stable point of the phase curve when the loop filter 31 performs control using the phase error signal on the basis of an output of the selection means 25 in the frequency error detector 8 and an output of the phase decision unit 29, and the loop filter 31 for outputting an oscillator control signal on the basis of an output of the start time setting means 30.

Figure 7:
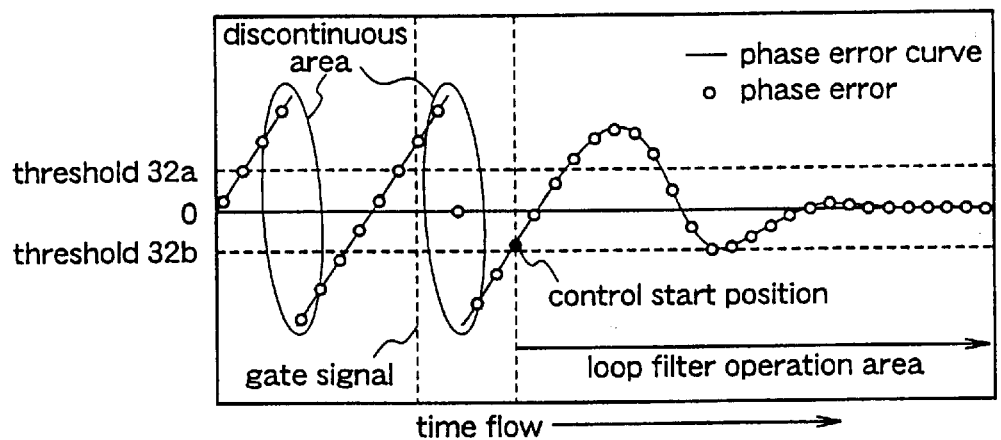
FIG. 7 is a diagram showing a temporal change of phase error information, for explaining an operation of a phase decision unit 29 as a constituent of the phase controlling loop filter 9 of the first or second embodiment.

As shown in FIG. 7, the phase decision unit 29 starts the phase control in an area between the thresholds 32a and 32b and immediately after a phase error having continuity is detected.

According to this construction, the time for performing the phase locking can be made equal to a case where the zero phase start is performed, i.e., the phase of the reproduction clock is adjusted so that the clock component included in the reproduction signal and the reproduction clock are in phase, and the phase locking is started.

[Embodiment 2]

Figure 10:
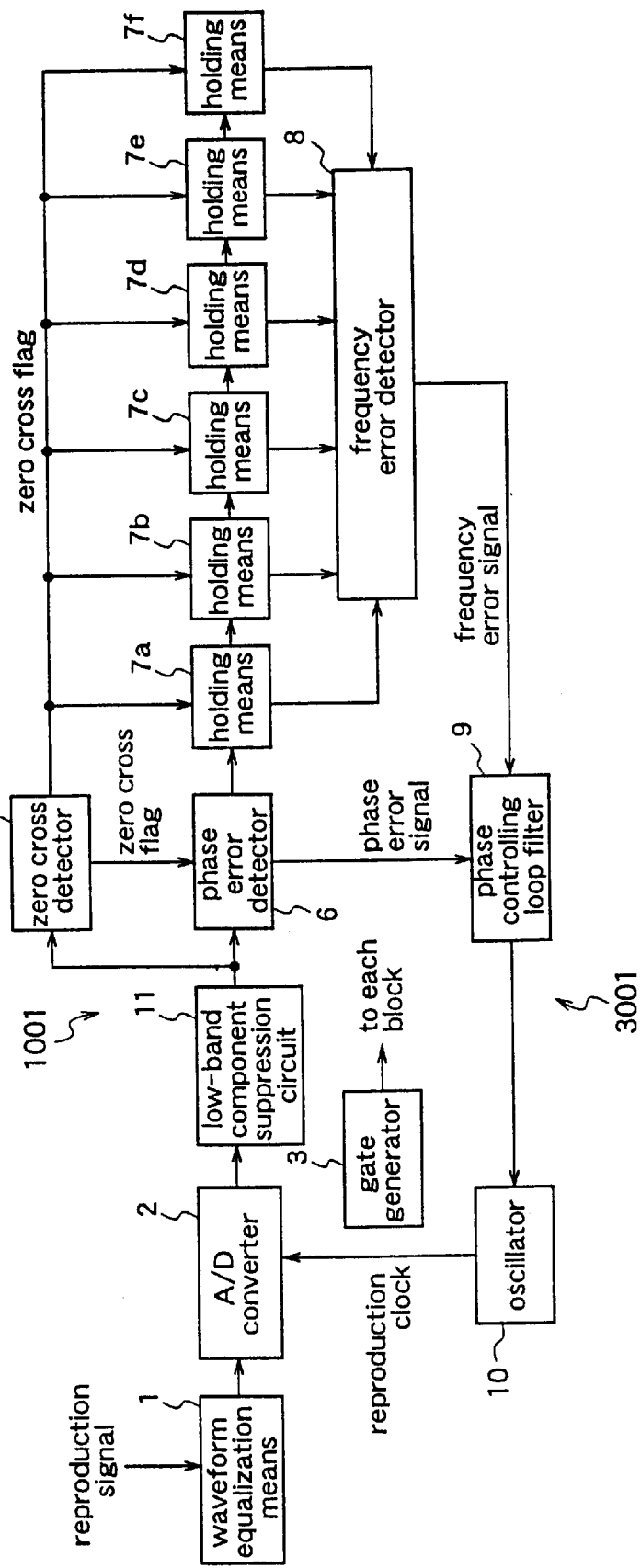
FIG. 10 is a block diagram illustrating a frequency detection type of phase-locked loop apparatus according to the second embodiment of the present invention.

FIG. 10 is a block diagram illustrating a frequency detection type of phase-locked loop apparatus according to a second embodiment of the present invention.

Figure 11:
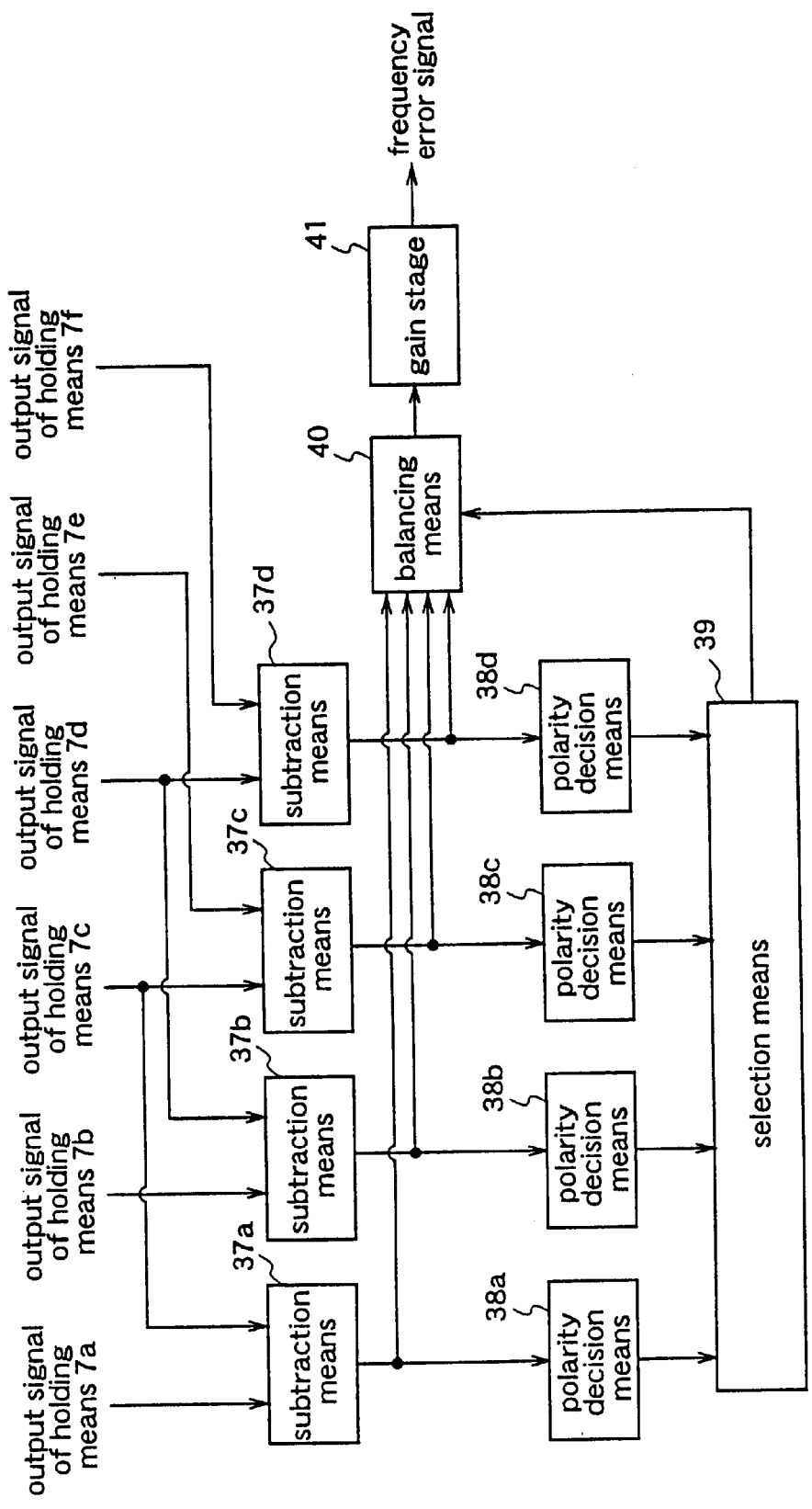
FIG. 11 is a block diagram illustrating a frequency error detection unit 8 of the second embodiment.

In this frequency detection type phase-locked loop apparatus of the second embodiment, the frequency error detector of the frequency detection type phase-locked loop apparatus of the first embodiment is replaced with a frequency error detector as shown in FIG. 11 and the HPF is omitted.

To be specific, a phase error information detection means 1001 for detecting phase error information from a random signal area in digital data is constituted by a waveform equalization means 1, an A/D converter 2, a gate generator 3, a low-band component suppression circuit 11, a zero cross detector 5, and a phase error detector 6. A frequency error information detection means 2001 for detecting frequency error information from a single frequency data area comprising a single frequency in the data format is constituted by the waveform equalization means 1, the A/D converter 2, the gate generator 3, the low-band component suppression circuit 11, the zero cross detector 5, the phase error detector 6, holding means 7a–7f, and a frequency error detector 8. A feedback loop 3001 for locking a phase of the reproduction clock and a phase of a clock component included in a reproduction digital signal on the basis of the phase error information and the frequency error information is constituted by a phase controlling loop filter 9, an oscillator 10, and the A/D converter 2.

FIG. 11 is a block diagram illustrating the frequency error detector according to the second embodiment.

As shown in FIG. 11, the frequency error detector of the second embodiment is constituted by a subtraction means 37a for subtracting an output of the holding means 7c from an output of the holding means 7a, a subtraction means 37b for subtracting an output of the holding means 7d from an output of the holding means 7b, a subtraction means 37c for subtracting an output of the holding means 7e from an output of the holding means 7c, a subtraction means 37d for subtracting an output of the holding means 7f from an output of the holding means 7d, polarity decision means 38a–38d for deciding which are polarities of outputs of the subtraction means 37a–37d among positive, negative and zero, a selection means 39 for removing information at a discontinuous point of a phase curve on the basis of outputs of the polarity decision means 38a–38d, and selecting information of an inclination where frequency information is stably obtained, a balancing means 40 for balancing only data which is decided by the selection means 39 that the phase error is data in a linear and continuous area of the phase curve, among the outputs of the subtraction means 37a–37d, and a gain stage 41 for arbitrarily adjusting a gain of an output of the balancing means 40, thereby outputting an output of the gain stage 41 as a frequency error signal.

Hereinafter, the operation will be described.

A reproduction signal from an optical disk or the like is corrected by the waveform equalization means 1 so as to emphasize high-band frequency components. Thereafter, this reproduction signal is sampled by the A/D converter 2 to obtain a multi-bit digital signal.

The multi-bit digital signal obtained by the sampling by the A/D converter 2 is input to the low-band component suppression circuit 11 and its low-band noises are suppressed. Thereafter, this signal is output to the zero cross detector 5 and the phase error detector 6.

When the digital signal whose low-band noises are suppressed by the low-band component suppression circuit 11 is input to the zero cross detector 5, the detector 5 detects a zero cross flag as a signal indicating a zero cross position, and outputs the zero cross flag to the phase error detector 6 and the holding means 7a–7f.

When the zero cross flag output by the zero cross detector 5 and the digital signal output by the low-band component suppression circuit 11 are input to the phase error detector 6, the detector 6 detects a phase error from data in the vicinity of the zero cross, and outputs the phase error to holding means 7a–7f and the phase controlling loop filter 9.

The phase error output by the phase error detector 6 is held by the holding means 7a on the basis of the zero cross flag output by the zero cross detector 5. At the same time, a phase error which is held by the holding means 7a immediately before is held by the holding means 7b, a phase error which is held by the holding means 7b immediately before is held by the holding means 7c, a phase error which is held by the holding means 7c immediately before is held by the holding means 7d, a phase error which is held by the holding means 7d immediately before is held by the holding means 7e, and a phase error which is held by the holding means 7e immediately before is held by the holding means 7f.

These holding means 7a–7f are connected in series with each other and hold continuous six phase errors.

The frequency error detector 8 detects an inclination of the phase error curve from the phase errors held by the respective holding means 7a–7f, converts the inclination into a frequency error, and outputs the frequency error to the phase controlling loop filter 9.

The phase controlling loop filter 9 locks the phase of the reproduction clock and the phase of the clock component included in the reproduction digital signal, using the phase error signal output by the phase error detector 6 and the frequency error signal output by the frequency error detector 8, and outputs the signal to the oscillator 10.

The oscillator 10 generates a reproduction clock on the basis of an output of the phase controlling loop filter 9, and outputs the reproduction clock to the A/D converter 2.

As described above, according to the second embodiment, even when a pattern recorded on the recording medium is random data which includes no VFO pattern and the frequency of the reproduction clock is significantly different from the frequency of the clock component included in the reproduction digital signal, a balanced frequency error is assumed using only the phase error in the linear and continuous area of the phase curve. Therefore, the capture range is extended, and the phase of the reproduction clock and the phase of the clock component included in the reproduction digital data are locked at a high speed and with good stability. In addition, also when re-locking of phase is required because of defects of the recording medium or the like, the re-locking time is reduced. Therefore, the deterioration in the quality of reproduced data due to burst errors or the like can be minimized.

In this second embodiment, six holding means 7a–7f are provided. However, "n" pieces ("n" is a positive integer) of holding means connected in series can be provided. The larger the "n" is, the more correctly the phase curve is reproduced.

[Embodiment 3]

Figure 12:
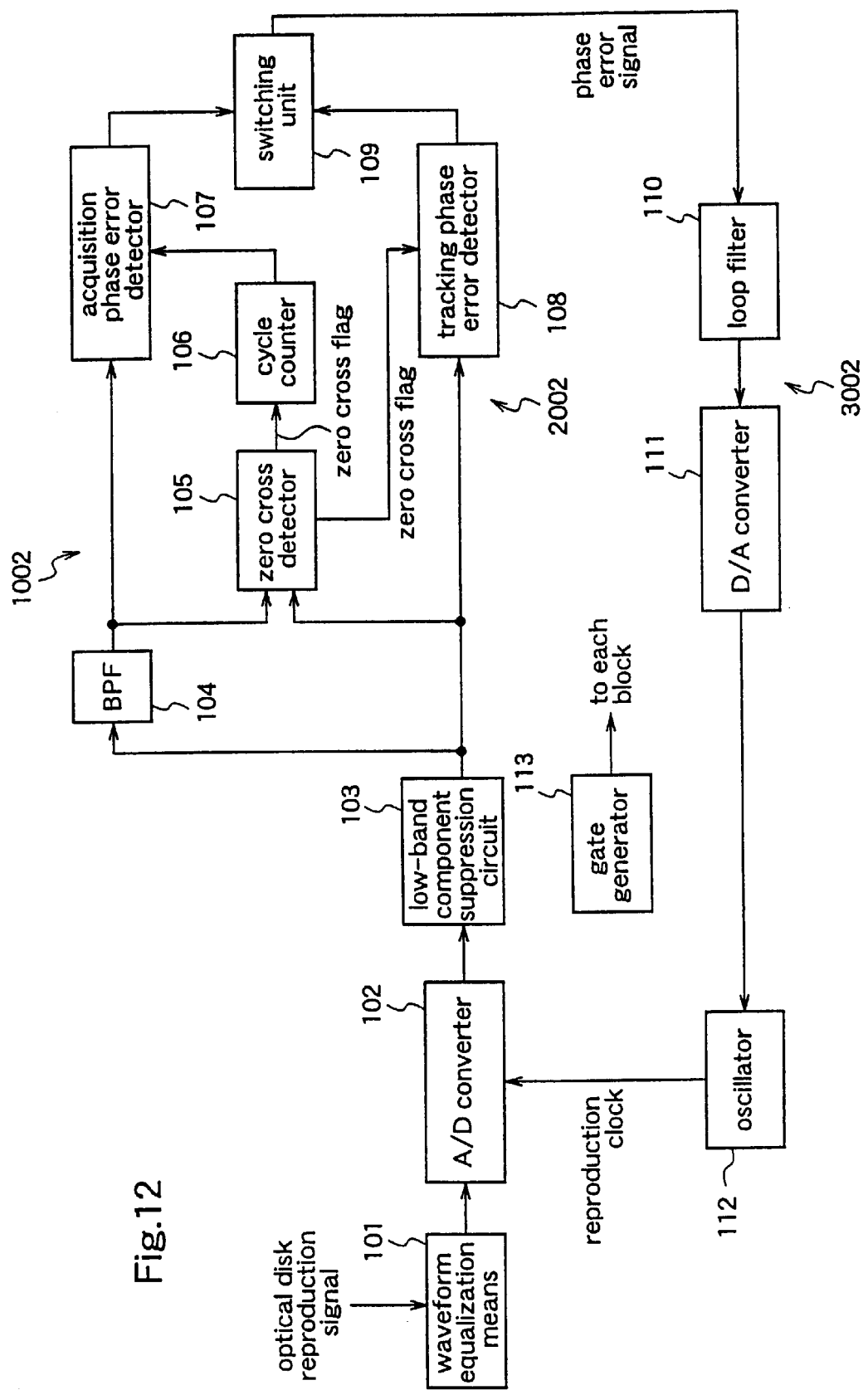
FIG. 12 is a block diagram illustrating a structure of a digital phase-locked loop circuit as a phase-locked loop apparatus according to a third embodiment of the present invention.

FIG. 12 is a block diagram illustrating a digital phase-locked loop circuit according to a third embodiment, as a phase-locked loop apparatus applied to an optical disk apparatus.

In FIG. 12, an acquisition phase error information detection means 1002 for detecting acquisition phase error information from a single frequency data area comprising a single frequency in a data format, is constituted by a waveform equalization means 101, an A/D converter 102, a low-band component suppression circuit 103, a gate generator 113, a BPF 104, a zero cross detector 105, a cycle counter 106, and an acquisition phase error detector 107. A tracking phase error information detection means 2002 for detecting tracking phase error information from a random signal data area comprising random signals in the digital data, is constituted by the waveform equalization means 1, the A/D converter 2, the low-band component suppression circuit 103, the gate generator 113, the zero cross detector 105, and a tracking phase error detector 108. A feedback loop 3002 for locking a phase of a reproduction clock and a phase of a clock component included in a reproduction digital signal on the basis of the acquisition phase error information and the tracking phase error information, is constituted by a switching unit 109, the gate generator 113, a loop filter 110, an D/A converter 111, an oscillator 112, and the A/D converter 102.

The waveform equalization means 101 is constituted by a high-order ripple filter or the like, which can arbitrarily set a boost amount and a cut-off frequency of an input signal, and it subjects an input optical disk reproduction signal to correction so as to emphasize its high-band. An output signal of the waveform equalization means 101 is supplied to the A/D converter 102. The A/D converter 2 samples the output signal of the waveform equalization means 101 (analog signal) using a reproduction clock generated by the oscillator 112, to obtain a multi-bit digital signal.

The multi-bit digital signal obtained by the sampling by the A/D converter 102 is input to the low-band component suppression circuit 103 for suppressing low-band noise components. As the low-band component suppression circuit 103, a unit having a structure of inputting amplitude information in the vicinity of a zero cross of the reproduction signal to a low-pass filter, and subtracting obtained low-band components from the input signal considering correlation of data, to suppress low-band noises can be used.

The digital phase-locked loop circuit as shown in FIG. 12 includes the gate generator 113 for generating a gate signal indicating whether a signal which is reproduced at present is a VFO pattern signal or not. As the gate generator 113, a unit for starting counting from the head of a sector by a counter with the reproduction clock as a reference signal, and outputting the gate signal which distinguishes between a VFO pattern area and a data area at a predetermined place in according with a count number can be utilized. The VFO pattern is the one where 4T patterns (T is a minimum recording unit) are continuously repeated, like a DVD-RAM (DVD random access memory).

Figure 13:
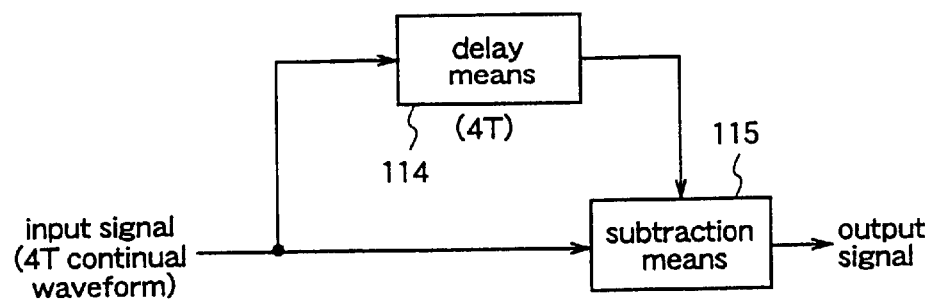
FIG. 13 is a block diagram illustrating a structure of a BPF shown in FIG. 12.

When an output signal of the gate generator 113 indicates that a VFO pattern is reproduced at present, an output signal of the low-band component suppression circuit 103 is input to the BPF (band-pass filter) 104 for removing DC (direct current) components. The BPF 104 is a digital filter which nulls the DC components in cycles of the VFO pattern. As the digital filter, a filter which is constituted by a delay means 114 for delaying an input signal for a time corresponding to 4T when the VFO pattern is a 4T continual waveform, and a subtraction means 115 for subtracting an output of the delay means 114 from present data, as shown in FIG. 13, can be utilized.

An output signal of the BPF 104 is input to the zero cross detector 105. The zero cross detector 105 is a circuit for detecting a position where an input signal crosses the zero level. Therefore, when the output signal of the BPF 104 is input to the zero cross detector 105, the zero cross detector 105 outputs a zero cross flag indicating a zero cross position of the output signal of the BPF 104.

Figure 14:
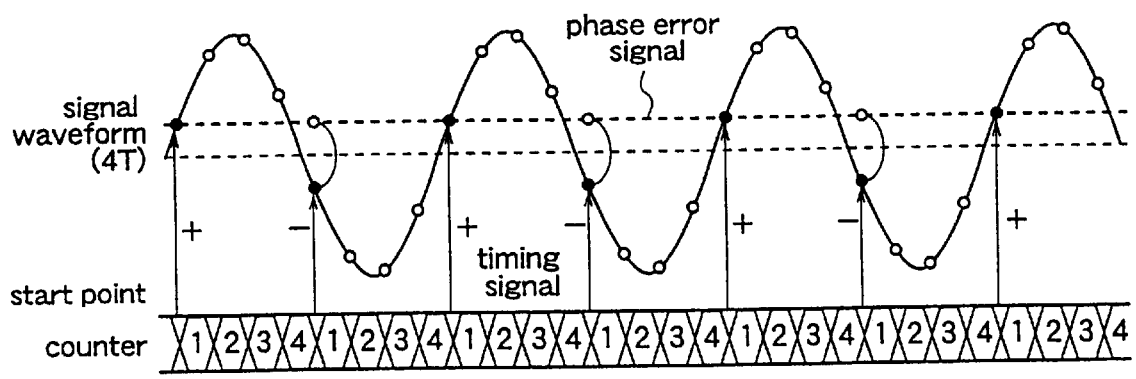
FIG. 14 is a diagram for explaining a relationship between a counting operation of a cycle counter shown in FIG. 12 and phase error signals.

The zero cross flag obtained by the zero cross detector 105 is supplied to the cycle counter 106. The cycle counter 106 performs counting continuously in an arbitrary cycle "n" which is proportional to the cycle of the VFO pattern signal with the zero cross flag as a starting point, and generates a timing when a phase error signal is to be extracted. When the VFO pattern is a 4T continual waveform as shown in FIG. 14, the zero cross detector 105 can simultaneously output characteristics when the phase error signal is generated from a signal amplitude, considering that directions of the input signal crossing the zero level of the reproduction signal are alternately switched between the leading and the trailing every 4T.

Figure 15:
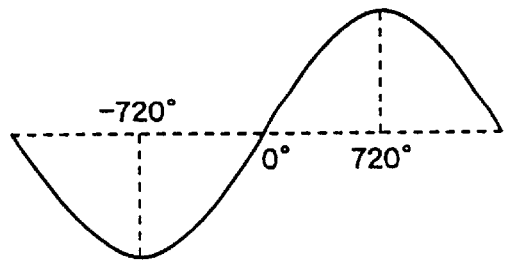
FIGS. 15a,b are diagrams for explaining continuity of phase error signals.
FIG. 15(b) is a diagram for explaining continuity of phase error signals in a prior art phase-locked loop.
Figure 15:
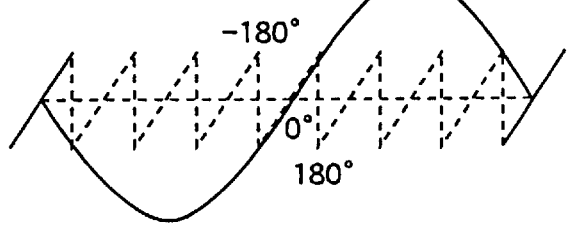

The timing signal obtained by the cycle counter 106 and the output signal of the BPF 104 are input to the acquisition phase error detector 107, and a phase error signal is detected from data which is essentially to be at the zero cross position by the acquisition phase error detector 107. Here, the acquisition phase error detector 107 has a function of generating continuous phase error signals of ±720° in the VFO pattern comprising 4T continual signals, as shown in FIG. 15(a). On the other hand, in the prior art phase error detector, only the continuity of approximately ±180° is ensured as shown in FIG. 15(b).

Figure 16:
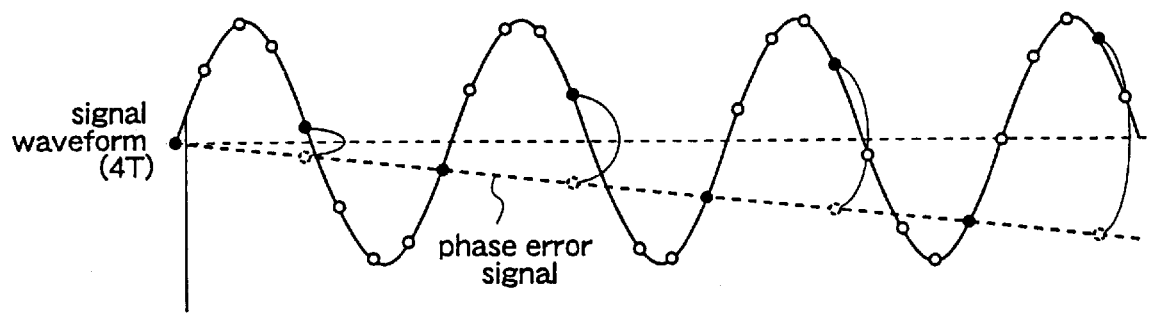
FIG. 16 is a diagram for explaining a phase error signal which is output by an acquisition phase error detector shown in FIG. 12 under conditions of different locking frequencies.

FIG. 16 shows a phase error signal which is output by the acquisition phase error detector 7 when the frequency of the reproduction clock is different from the frequency of the clock component included in the reproduction digital data. As shown in FIG. 16, sampled data which is essentially at the zero cross position at the phase locking can be securely tracked also when the frequencies are different from each other, and therefore the continuous area of the phase error signal is expanded.

On the other hand, when the output signal of the gate generator 113 indicates that data other than the VFO pattern is reproduced at present, an output signal of the low-band component suppression circuit 103 is input to the zero cross detector 105. Then, the zero cross detector 105 outputs a zero cross flag indicating a zero cross position. In this case, the obtained zero cross flag and the output signal of the low-band component suppression circuit 103 are input to the tracking phase error detector 108, whereby the phase error signal is always detected from data in the vicinity of the zero cross.

The phase error signal output by the acquisition phase error detector 107 and the phase error signal output by the tracking phase error detector 108 are input to the switching unit 109, switched according to the output signal of the gate generator 113, and supplied to the loop filter 110. The loop filter 110 receives either of these phase,error signals as an input signal, and operates so that the phase of the reproduction clock and the phase of the clock component included in the reproduction digital signal are locked.

An output signal of the loop filter 110 is converted into an analog signal by the D/A converter 111, and this analog signal is supplied to the oscillator 112. The oscillator 112 generates a reproduction clock with t he analog signal as a reference. In this case, the oscillator 112 can be constituted by a VCO (Voltage Controlled Oscillator) for controlling an oscillated frequency by the voltage. When the VCO is constituted by a digital element, the D/A converter is not required.

In the digital phase-locked loop circuit having the above construction, a correct phase error is detected even when the reproduction signal includes the DC components in the VFO pattern area, whereby the VFO pattern area can be effectively utilized. In addition, the continuous arc of the phase error curve is expanded, whereby the capture range can be significantly extended. Accordingly, even when the frequency of the reproduction clock is substantially different from the frequency of the clock component included in the reproduction signal, the phase of the reproduction clock and the phase of the clock component included in the reproduction digital data can be locked at a high speed and with good stability. Therefore, the clock reproduction which is required for the reproduction of digital data recorded on a recording medium can be performed.

[Embodiment 4]

In the case of data where no VFO pattern is included in patterns recorded on an optical disk medium such as DVD-ROM and CD-ROM, the reproduction signal is a random signal. In such data, when only the phase error detection is performed, a capture range is narrow when a phase of a clock component included in the reproduction signal and a phase of a reproduction clock are locked. Therefore, when both frequencies are quite different from each other, the phase locking cannot be performed surely or the phase locking utilizing the VFO pattern cannot be performed when the phase locking is restored immediately after a burst error. A fourth embodiment of the present invention is directed to solve these problems. A structure of a phase-locked loop apparatus according to the fourth embodiment is shown in FIG. 17.

Figure 17:
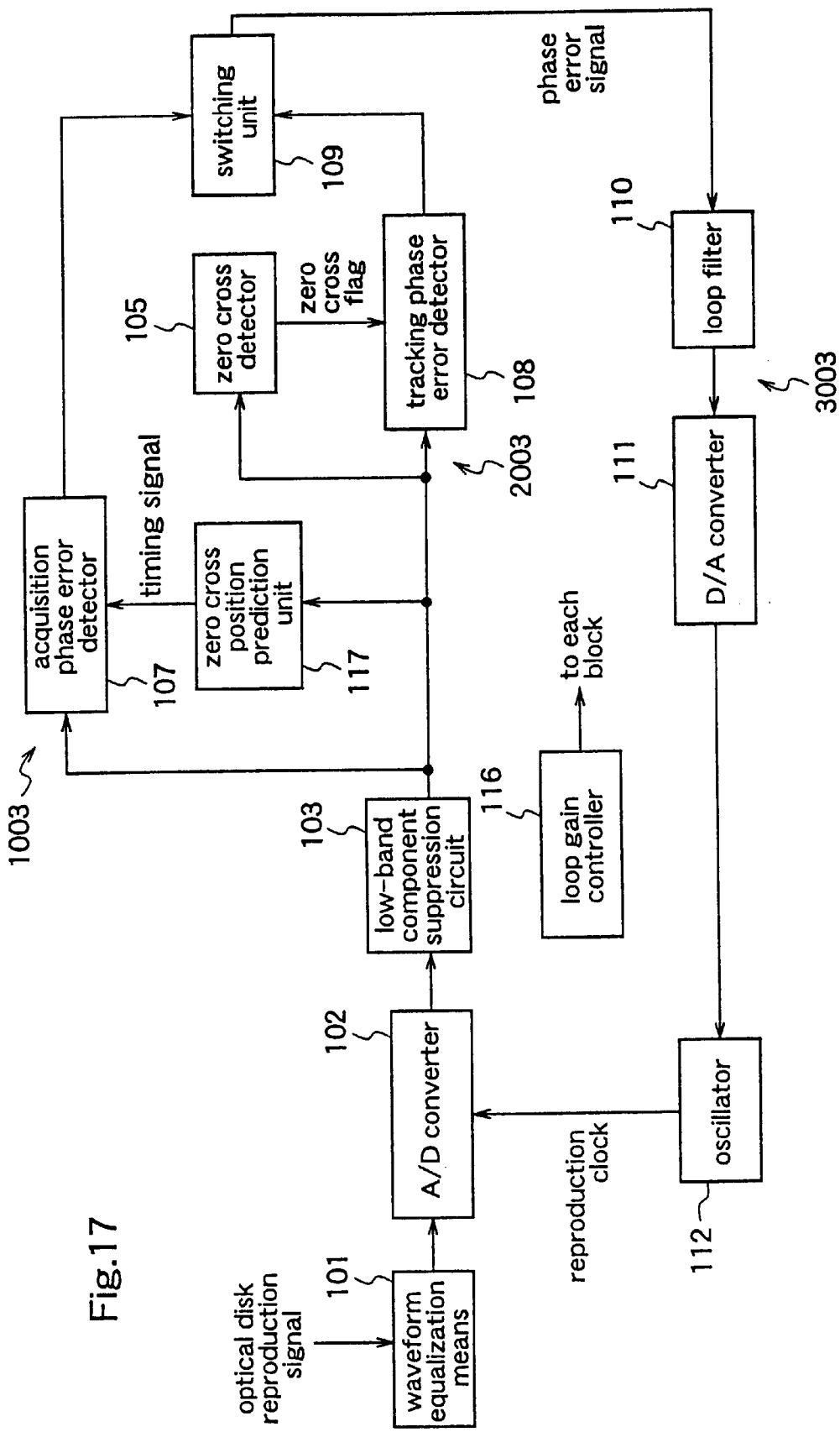
FIG. 17 is a block diagram illustrating a structure of a digital phase-locked loop circuit as a phase-locked loop apparatus according to a fourth embodiment of the present invention.

In FIG. 17, a waveform equalization means 101, an A/D converter 102, and a low-band component suppression circuit 103 are the same as those in the third embodiment as shown in FIG. 12. To be specific, the waveform equalization means 101 for receiving an optical disk reproduction signal is constituted by a high-order ripple filter or the like, which can arbitrarily set a boost amount and a cut-off frequency of the input signal and it subjects the input optical disk reproduction signal to the correction so as to emphasize its high-band.

A first phase error information detection means 1003 for obtaining first phase error information by prediction of a zeros cross position in a random signal area of digital data is constituted by the waveform equalization means 101, the A/D converter 102, the low-band component suppression circuit 103, a loop gain controller 116, a zero cross position prediction unit 117, and an acquisition:;phase error detector 107. A second phase error information detection means 2003 for detecting second phase error information from a random signal in the digital data is constituted by the waveform equalization means 101, the A/D converter 102, the low-band component suppression circuit 103, the loop gain controller 116, a zero cross detector 105, and a tracking phase error detector 108. A feedback loop 3003 for locking a phase of the reproduction clock and a phase of a clock component included in the reproduction digital signal on the basis of the first phase error information and the second phase error information is constituted by a switching unit 109, a loop filter 110, a D/A converter 111, an oscillator 112, and the A/D converter 102.

An output signal of the waveform equalization means 101 is supplied to the A/D converter 102. The A/D converter 102 samples the output signal of the waveform equalization means 101 (analog signal) using a reproduction clock generated by the oscillator 112, to obtain a multi-bit digital signal.

The multi-bit digital signal obtained by the sampling by the A/D converter 102 is input to the low-band component suppression circuit 103 for suppressing low-band noises. As the low-band component suppression circuit 103, a unit having a structure of inputting amplitude information in the vicinity of the zero cross of the reproduction signal to a low-pass filter, and subtracting obtained low-band components from the input signal considering correlation of data, thereby to suppress the low-band noises can be utilized as the third embodiment.

In the fourth embodiment, the loop gain controller 116 is provided to obtain a strong phase-locking capacity in an arbitrary section from phase-locking start. The loop gain controller 116 supplies a control gate signal of the loop gain. As the loop gain controller 116, a unit for starting counting from the head of a sector by a counter with the reproduction clock as a reference signal, and outputting the gain control signal for selecting an acquisition area where emphasis is laid on high-speed locking or a tracking area where emphasis is laid on stability, according to the count number at a predetermined place can be utilized. In addition, as the loop gain controller 116, a unit which has a function of self-detecting that the frequency of the reproduction clock and the frequency of the clock component included in the reproduction digital data become closer to each other, and performing gain switching can also be utilized.

In this fourth embodiment, the zero cross position prediction unit 117 is provided for, when an output signal of the loop gain controller 116 indicates that the acquisition area is reproduced at present, deciding polarity of the output signal of the low-band component suppression circuit 103, predicting data which is at an original zero cross position on the basis of multi-valued level information which is obtained by adding results of the polarities at different times, and outputting a timing signal for deciding a position where the phase error signal is output. Then, the timing signal obtained by the zero cross position prediction unit 117 and the output signal of the low-band component suppression circuit 103 are input to the acquisition phase error detector 107, and the phase error signal is detected from the data which is essentially to be at the zero cross position.

In this case, as a method for processing a PRML signal, the zero cross position prediction unit 117 utilizes a PR (a,b, b,a) ML method having a transmission characteristic where four continuous times are given by an expression of a+b*D+ b*$D^2$+a*$D^3$ ($D^n$ is a signal which is delayed for nT from a reference time). The zero cross position prediction unit 117 can have a structure as shown in FIG. 18, when there is no signal of less than 3T as a data format, like DVDs or CDs.

Figure 18:
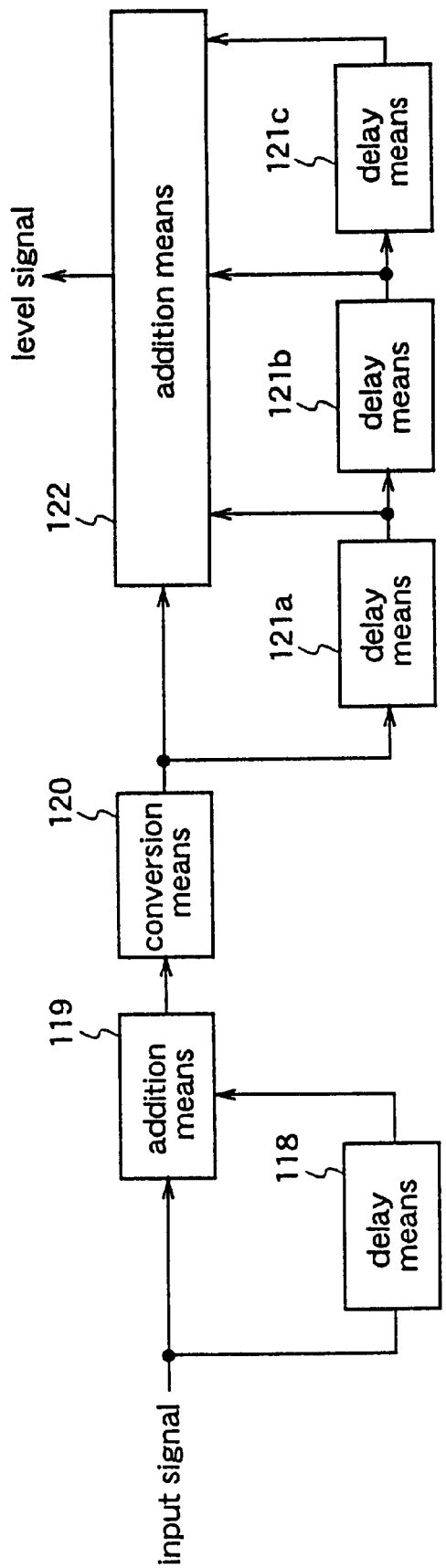
FIG. 18 is a block diagram illustrating a structure of a zero cross position prediction unit shown in FIG. 17.
Figure 19:
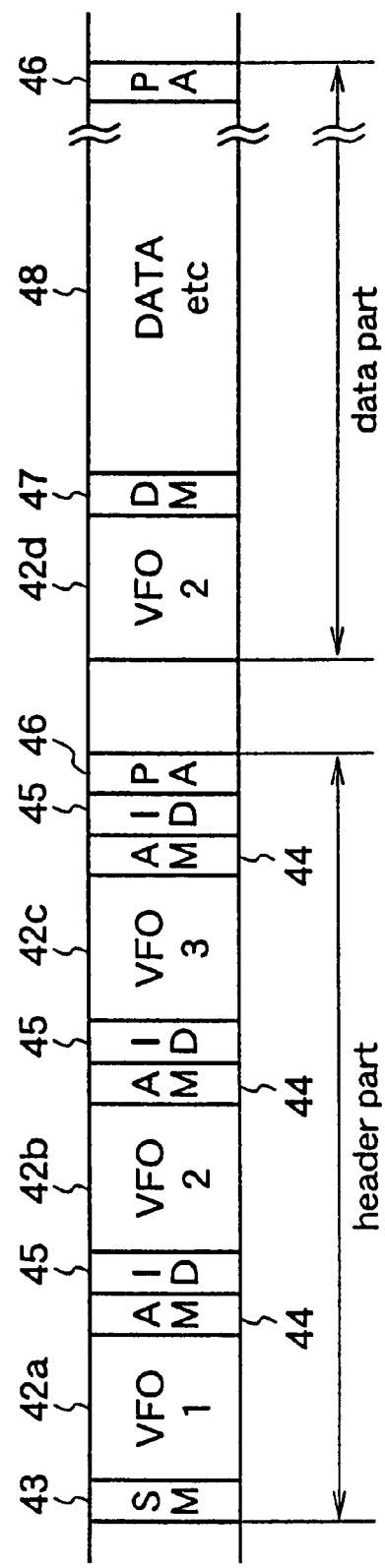
FIG. 19 is a diagram showing a data format in a sector of an optical disk reproduction apparatus (DVD-RAM).
Figure 20:
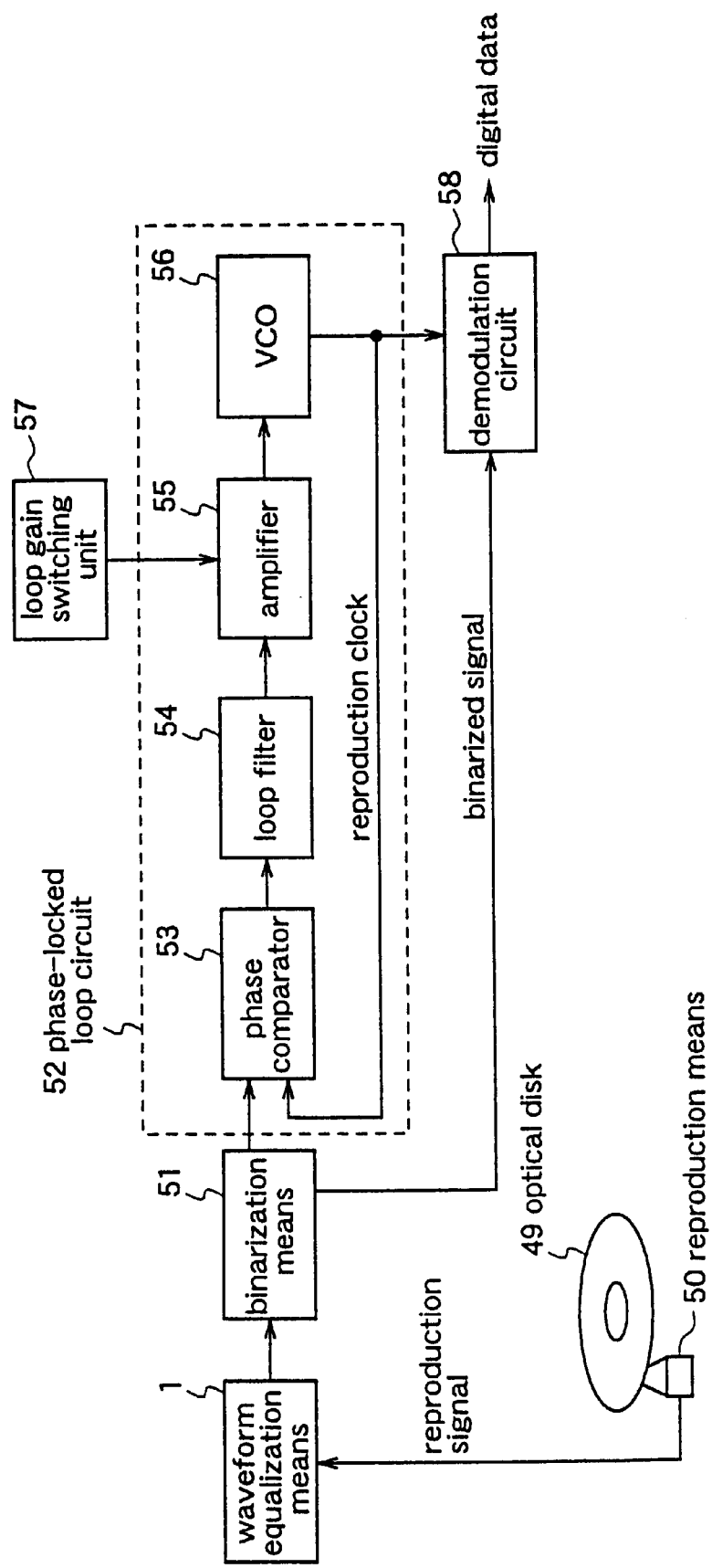
FIG. 20 is a block diagram illustrating a prior art optical disk reproduction apparatus.

The zero cross position prediction unit 117 as shown in FIG. 18 is constituted by a delay means 118 for delaying an input signal for 1T, an addition means 119 for adding the input signal and an output signal of the delay means 118, a conversion means 120 for outputting 1 when a polarity of an output signal of the addition means 119 is positive and outputting 0 when the polarity is negative, delay means 121a, 121b, and 121c for each delaying an output signal of the conversion means 120 for 1T, and an addition means 122 for adding output signals of continuous times of 4T from the conversion means 120 and the delay means 121a, 121b, and 121c. On the basis of level information of 5 levels (i.e., 0 to 4) obtained from the addition means 122, which information has correlation with the input signal, the zero cross position prediction unit 117 specifies that a position of 2 is the zero cross position, for example and outputs a timing signal.

When the output signal of the loop gain controller 116 indicates that the tracking area is reproduced at present, the output signal of the low-band component suppression circuit 103 is input to the zero cross detector 105, thereby to obtain a zero cross flag as a signal indicating the zero cross position. Then, the obtained zero cross flag and the output signal of the low-band component suppression circuit 103 are input to the tracking phase error detector 108, whereby the phase error signal is always detected from data in the vicinity of the zero cross.

The phase error signal output by the acquisition phase error detector 107 and the phase error signal output by the tracking phase error detector 108 are input to the switching unit 109, switched according to the output signal of the loop gain controller 116, and supplied to the loop filter 110. The loop filter 110 receives the phase error signal as an input signal, and operates so that the phase of the reproduction clock and the phase of the clock component included in the reproduction digital signal are locked.

An output signal of the loop filter 110 is converted into an analog signal by the D/A converter 111 and this analog signal is supplied to the oscillator 112. The oscillator 112 generates a reproduction clock on the basis of the analog signal. Here, the oscillator 112 can be constituted by a VCO (Voltage Controlled Oscillator) controlling an oscillated frequency by the voltage, or can be constituted by a digital element. When the VCO is constituted by the digital element, the D/A converter is not required.

According to the fourth embodiment, a continuous area of the phase error curve is expanded also for digital data which includes no pattern signal comprising a single frequency in a data format, whereby the capture range is substantially extended. Therefore, even when the frequency of the reproduction clock is substantially different from the frequency of the clock component included in the reproduction signal, the phase of the reproduction clock and the phase of the clock component included in the reproduction digital data is locked at a high speed and with good stability, whereby the clock reproduction required for the reproduction of digital data recorded on a recording medium can be realized. In addition, when re-locking of phase is required because of defects or the like, the re-locking time can be reduced. Therefore, the deterioration in the quality of reproduced data due to burst errors or the like can be minimized.

INDUSTRIAL AVAILABILITY

As described above, a phase-locked loop apparatus according to the present invention is suitable for extension of a capture range when a phase-locked loop which is used to reproduce a clock for reproducing digital data recorded on recording media such as optical disk media, magneto-optical disk media, and magnetic media, is made as a digital circuit.

What is claimed is:

1. A phase-locked loop apparatus for reading digital data recorded on a recording medium in a predetermined data format, and generating a reproduction clock for obtaining a reproduction digital signal, said apparatus comprising:

a phase error information detection means for detecting phase error information from a signal area other than a single frequency data area comprising a single frequency in the data format;

a frequency error information detection means for detecting frequency error information from the single frequency data area comprising the single frequency in the data format; and a feedback loop for performing control on the basis of the frequency error information in a single frequency data area and performing control on the basis of the phase error information in an area other than the single frequency data area so as to lock a phase of the reproduction clock and a phase of a clock component included in the reproduction digital signal on the basis of the phase error information and the frequency error information.

2. A phase-locked loop apparatus for reading digital data recorded on a recording medium in a predetermined data format, and generating a reproduction clock for obtaining a reproduction digital signal, said apparatus comprising:

a waveform equalization device operable to emphasize a predetermined frequency band of a reproduction signal;

an A/D conversion device operable to sample the reproduction signal, the predetermined frequency band of which is emphasized by said waveform equalization device, using a reproduction clock at a time when a digital signal is reproduced, to obtain a digital signal;

a high-pass filter (HPF) device operable to remove DC components from the digital signal obtained by the sampling when the obtained digital signal is a VFO pattern signal;

a low-band component suppression device operable to suppress low-band noises of the digital signal obtained by the sampling when the obtained digital signal is a signal other than the VFO pattern signal;

a zero cross detection device operable to detect a position where an output of said HPF device or said low-band component suppression device crosses a zero level, and outputting a zero cross flag;

a phase error detection device operable to detect a phase error from data in the vicinity of a zero cross using the zero cross flag and the output of said HPF device or said low-band component suppression device;

"n" pieces of holding devices operable to hold continuous "n" ("n" is a positive integer) pieces of the phase errors on the basis of the zero cross flag, said holding devices being connected in series with each other;

a frequency error detection device operable to detect an inclination of a phase error curve from outputs of said respective "n" pieces of holding devices, and convert the inclination into a frequency error;

a phase controlling loop filter device operable to receive a phase error signal which is an output of said phase error detection device and a frequency error signal which is an output of said frequency error detection device as input signals when the digital signal obtained by the sampling is the VFO pattern signal, and receive the phase error signal which is the output of said phase error detection device as an input signal when the obtained digital signal is a signal other than the VFO pattern signal; and an oscillator device operable to generate a reproduction clock on the basis of an output of said phase controlling loop filter device.

3. A phase-locked loop apparatus for reading digital data recorded on a recording medium in a predetermined data format, and generating a reproduction clock for obtaining a reproduction digital signal, said apparatus comprising:

a waveform equalization device operable to emphasize a predetermined frequency band of a reproduction signal;

an A/D conversion device operable to sample the reproduction signal, the predetermined frequency band of which is emphasized by said waveform equalization device, using a reproduction clock at a time when a digital signal is reproduced to obtain a digital signal;

a low-band component suppression device operable to suppress low-band noises of the digital signal obtained by the sampling;

a zero cross detection device operable to detect a position where an output of said low-band component suppression device crosses a zero level, and output a zero cross flag;

a phase error detection device operable to detect a phase error from data in the vicinity of a zero cross using the zero cross flag and the output of said low-band component suppression device;

"n" pieces of holding devices operable to hold continuous "n" ("n" is a positive integer) pieces of the phase errors on the basis of the zero cross flag, said holding devices being connected in series with each other;

a frequency error detection device operable to detect an inclination of a phase error curve from outputs of said respective "n" pieces of holding devices, and convert the inclination into a frequency error;

a phase controlling loop filter device operable to receive a phase error signal which is an output of said phase error detection device and a frequency error signal which is an output of said frequency error detection device as input signals; and an oscillator device operable to generate a reproduction clock on the basis of an output of said phase controlling loop filter device.

4. The phase-locked loop apparatus of claim 2, wherein said phase error detection device comprises:

a first holding device and a second holding device operable to hold amplitudes of reproduction signals at adjacent zero cross positions for each zero cross on the basis of the zero cross flag;

a subtraction device operable to receive an output of said first holding device and an output of said second holding device as inputs;

a polarity decision device operable to decide whether a reproduction waveform at a timing when the amplitude is held by said first holding device is a leading edge or a trailing edge on the basis of previous and subsequent data; and a sign manipulation device operable to manipulate a sign of an output of said subtraction device on the basis of an output of the polarity decision device.

5. The phase-locked loop apparatus of claim 2, wherein said frequency error detection device comprises:

plural subtraction devices each being operable to obtain a difference between the phase errors output by predetermined two holding devices among said "n" pieces of holding devices;

a polarity decision device operable to decide which is a polarity of an output of each of said plural subtraction devices among positive, negative, and zero;

a selection device operable to remove information at a discontinuous point of the phase error curve on the basis of plural inclination information output by said plural subtraction devices, and select information of an inclination where frequency information is obtained stably;

a balancing device operable to balance the inclination information selected by said selection device; and a gain stage device operable to arbitrarily adjust a gain of an output of said balancing device, and output the adjusted gain to said phase controlling loop filter device.

6. The phase-locked loop apparatus of claim 2, wherein:

said frequency error detection device comprises:

plural subtraction devices each being operable to obtain a difference between the phase errors output by predetermined two holding devices among said "n" pieces of holding devices;

a polarity decision device operable to decide which is a polarity of an output of each of said plural subtraction devices among positive, negative, and zero;

a selection device operable to remove information at a discontinuous point of the phase error curve on the basis of plural inclination information output by said plural subtraction devices, and select information of an inclination where frequency information is obtained stably;

a balancing device operable to balance the inclination information selected by said selection device; and a gain stage device operable to arbitrarily adjust a gain of an output of said balancing device, and output the adjusted gain to said phase controlling loop filter device;

said phase controlling loop filter device comprises:
  a phase error absolute value conversion device operable to convert the output of said phase error detection device into an absolute value;
  a phase decision device operable to decide a magnitude of the obtained absolute value with a predetermined threshold;
  a start time setting device operable to manipulate a control start time so as to start an operation of a loop filter from the vicinity of a zero phase as a stable point of a phase curve when control is executed using the phase error signal on the basis of an output of said selection device of said frequency error detection device and an output of said phase decision device; and
  a loop filter device operable to output a control signal for said oscillator device on the basis of an output of said start time setting device.

7. The phase-locked loop apparatus of claim 2, wherein said phase controlling loop filter device comprises:
  a frequency error absolute value conversion device operable to convert the output of said frequency error detection device into an absolute value;
  a frequency decision device operable to decide a magnitude of the obtained absolute value with a predetermined threshold;
  an error selection device operable to perform switching on the basis of an output of said frequency decision device so that control is executed using only the phase error signal when a frequency of the reproduction clock is within a phase locked range, and using only the frequency error signal when the frequency of the reproduction clock is outside the phase locked range; and
  a loop filter device operable to output a control signal for said oscillator device on the basis of an output of said error selection device.

8. A phase-locked loop apparatus for reading digital data recorded on a recording medium in a predetermined data format, and generating a reproduction clock for obtaining a reproduction digital signal, said apparatus comprising:
  an acquisition phase error information detection means for detecting acquisition phase error information from a single frequency data area comprising a single frequency in the data format;
  a tracking phase error information detection means for detecting tracking phase error information from a random signal data area comprising a random signal in the digital data; and
  a feedback loop for performing control on the basis of the tracking phase error information in a single frequency data area and performing control on the basis of the tracking phase error information in a random signal data area so as to lock a phase of the reproduction clock and a phase of a clock component included in the reproduction digital signal on the basis of the acquisition phase error information and the tracking phase error information.

9. A phase-locked loop apparatus for reading digital data recorded on a recording medium in a predetermined data format, and generating a reproduction clock for obtaining a reproduction digital signal, said apparatus comprising:
  an A/D conversion device operable to sample digital data in the data format with a reproduction clock to obtain a digital data signal;
  a band-pass filter device operable to remove direct current components from the digital data signal obtained by the sampling during reproduction of a single frequency data area in the data format;
  a zero cross detection device operable to detect positions where an output signal of said band-pass filter device and the digital data signal cross a zero level, and output respective zero cross flags;
  a cycle counter device operable to start counting with the zero cross flag as a start point;
  an acquisition phase error detection device operable to detect a phase error from the output signal of said band-pass filter at a timing when a timing signal is obtained by said cycle counter device;
  a tracking phase error detection device operable to detect a phase error of the digital data signal on the basis of the zero cross flag;
  a loop filter device operable to receive a phase error signal which is an output of said acquisition phase error detection device as an input signal when the digital signal obtained by the sampling is a VFO pattern signal, and receive a phase error signal which is an output of said tracking phase error detection device as an input signal when the obtained digital signal is a signal other than the VFO pattern signal;
  a D/A conversion device operable to convert an output signal of said loop filter device into an analog signal; and
  an oscillator device operable to generate the reproduction clock on the basis of the analog signal output by said D/A conversion device.

10. A phase-locked loop apparatus for reading digital data recorded on a recording medium in a predetermined data format, and generating a reproduction clock for obtaining a reproduction digital signal, said apparatus comprising:
  a first phase error information detection means for obtaining first phase error information from prediction of a zero cross position in a random signal area in the digital data;
  a second phase error information detection means for detecting second phase error information from a random signal in the digital data; and
  a feedback loop for locking a phase of the reproduction clock and a phase of a clock component included in the reproduction digital signal on the basis of the first phase error information and the second phase error information.

11. A phase-locked loop apparatus for reading digital data recorded on a recording medium in a predetermined data format, and generating a reproduction clock for obtaining a reproduction digital signal, said apparatus comprising:

a loop gain control device operable to output a loop gain control signal for increasing a phase-locking capacity for a predetermined period from a phase-locking start;

an A/D conversion device operable to sample the digital data with a reproduction clock to obtain a digital data signal;

a zero cross position prediction device operable to predict a zero cross position of random data in the digital data signal obtained by the sampling;

an acquisition phase error detection device operable to detect phase error information of the random data from an output signal of said zero cross position prediction device and the digital data signal;

a zero cross detection device operable to detect a position where the obtained digital data signal crosses a zero level, and output a zero cross flag;

a tracking phase error detection device operable to detect a phase error of the digital data signal on the basis of the zero cross flag;

a loop filter device operable to receive a phase error signal which is an output of said acquisition phase error detection device as an input signal, and receive a phase error signal which is an output of said tracking phase error detection device as an input signal;

a D/A conversion device operable to convert an output signal of said loop filter device into an analog signal; and an oscillator device operable to generate the reproduction clock on the basis of the analog signal output by said D/A conversion device.

12. The phase-locked loop apparatus of claim 3, wherein said phase error detection device comprises:

a first holding device and a second holding device operable to hold amplitudes of reproduction signals at adjacent zero cross positions for each zero cross on the basis of the zero cross flag;

a subtraction device operable to receive an output of said first holding device and an output of said second holding device as inputs;

a polarity decision device operable to decide whether a reproduction waveform at a timing when the amplitude is held by said first holding device is a leading edge or a trailing edge on the basis of previous and subsequent data; and a sign manipulation device operable to manipulate a sign of an output of said subtraction device on the basis of an output of the polarity decision device.

13. The phase-locked loop apparatus of claim 3, wherein said frequency error detection device comprises:

plural subtraction devices each being operable to obtain a difference between the phase errors output by predetermined two holding devices among said "n" pieces of holding devices;

a polarity decision device operable to decide which is a polarity of an output of each of said plural subtraction devices among positive, negative, and zero;

a selection device operable to remove information at a discontinuous point of the phase error curve on the basis of plural inclination information output by said plural subtraction devices, and select information of an inclination where frequency information is obtained stably;

a balancing device operable to balance the inclination information selected by said selection device; and a gain stage device operable to arbitrarily adjust a gain of an output of said balancing device, and output the adjusted gain to said phase controlling loop filter device.

14. The phase-locked loop apparatus of claim 3, wherein:

said frequency error detection device comprises:

plural subtraction devices each being operable to obtain a difference between the phase errors output by predetermined two holding devices among said "n" pieces of holding devices;

a polarity decision device operable to decide which is a polarity of an output of each of said plural subtraction devices among positive, negative, and zero;

a selection device operable to remove information at a discontinuous point of the phase error curve on the basis of plural inclination information output by said plural subtraction devices, and select information of an inclination where frequency information is obtained stably;

a balancing device operable to balance the inclination information selected by said selection device; and a gain stage device operable to arbitrarily adjust a gain of an output of said balancing device, and output the adjusted gain to said phase controlling loop filter device;

said phase controlling loop filter device comprises:

a phase error absolute value conversion device operable to convert the output of said phase error detection device into an absolute value;

a phase decision device operable to decide a magnitude of the obtained absolute value with a predetermined threshold;

a start time setting device operable to manipulate a control start time so as to start an operation of a loop filter from the vicinity of a zero phase as a stable point of a phase curve when control is executed using the phase error signal on the basis of an output of said selection device of said frequency error detection device and an output of said phase decision device; and a loop filter device operable to output a control signal for said oscillator device on the basis of an output of said start time setting device.

15. The phase-locked loop apparatus of claim 3, wherein said phase controlling loop filter device comprises:

a frequency error absolute value conversion device operable to convert the output of said frequency error detection device into an absolute value;

a frequency decision device operable to decide a magnitude of the obtained absolute value with a predetermined threshold;

an error selection device operable to perform switching on the basis of an output of said frequency decision device, so that control is executed using only the phase error signal when a frequency of the reproduction clock is within a phase locked range, and using only the frequency error signal when the frequency of the reproduction clock is outside the phase locked range; and a loop filter device operable to output a control signal for said oscillator device on the basis of an output of said error selection device.

16. A phase-locked loop method for reading digital data recorded on a recording medium in a predetermined data format, and generating a reproduction clock for obtaining a reproduction digital signal, said method comprising:

emphasizing a predetermined frequency band of a reproduction signal;

sampling the reproduction signal, the predetermined frequency band of which is emphasized by said emphasizing, using a reproduction clock at a time when a digital signal is reproduced, to obtain a digital signal;

removing DC components from the digital signal obtained by said sampling when the obtained digital signal is a VFO pattern signal;

suppressing low-band noises of the digital signal obtained by said sampling when the obtained digital signal is a signal other than the VFO pattern signal;

detecting a position where an output of said removing or said suppressing crosses a zero level, and outputting a zero cross flag;

detecting a phase error from data in the vicinity of a zero cross using the zero cross flag and the output of said removing or said suppressing;

holding continuous "n" ("n" is a positive integer) pieces of the phase errors on the basis of the zero cross flag;

detecting an inclination of a phase error curve from outputs of said holding continuous "n" pieces of the phase errors, and converting the inclination into a frequency error;

receiving a phase error signal which is an output of said detecting the phase error and a frequency error signal which is an output of said detecting the inclination of the phase error curve as input signals when the digital signal obtained by said sampling is the VFO pattern signal, and receiving the phase error signal which is the output of said detecting the phase error as an input signal when the obtained digital signal is a signal other than the VFO pattern signal; and generating a reproduction clock on the basis of an output of said receiving.

17. A phase-locked loop method for reading digital data recorded on a recording medium in a predetermined data format, and generating a reproduction clock for obtaining a reproduction digital signal, said method comprising:

emphasizing a predetermined frequency band of a reproduction signal;

sampling the reproduction signal, the predetermined frequency band of which is emphasized by said emphasizing, using a reproduction clock at a time when a digital signal is reproduced to obtain a digital signal;

suppressing low-band noises of the digital signal obtained by said sampling;

detecting a position where an output of said suppressing crosses a zero level, and outputting a zero cross flag;

detecting a phase error from data in the vicinity of a zero cross using the zero cross flag and the output of said suppressing;

holding continuous "n" ("n" is a positive integer) pieces of the phase errors on the basis of the zero cross flag;

detecting an inclination of a phase error curve from outputs of said holding continuous "n" pieces of phase errors, and converting the inclination into a frequency error;

receiving a phase error signal which is an output of said detecting a phase error and a frequency error signal which is an output of said detecting an inclination of a phase error curve as input signals; and generating a reproduction clock on the basis of an output of said receiving.

18. A phase-locked loop method for reading digital data recorded on a recording medium in predetermined data format, and generating a reproduction clock for obtaining a reproduction digital signal, said method comprising:

sampling digital data in the data format with a reproduction clock to obtain a digital data signal;

removing direct current components from the digital data signal obtained by said sampling during reproduction of a single frequency data area in the data format;

detecting positions where an output signal of said removing and the digital data signal cross a zero level, and outputting respective zero cross flags;

counting with the zero cross flag as a start point;

detecting a phase error from the output signal of said removing at a timing when a timing signal is obtained by said counting;

detecting a phase error of the digital data signal on the basis of the zero cross flag;

receiving a phase error signal which is an output of said detecting a phase error from the output signal as an input signal when the digital signal obtained by said sampling is a VFO pattern signal, and receiving a phase error signal which is an output of said detecting a phase error of the digital data signal as an input signal when the obtained digital signal is a signal other than the VFO pattern signal;

converting an output signal of said receiving into an analog signal; and generating the reproduction clock on the basis of the analog signal output by said converting.

19. A phase-locked loop method for reading digital data recorded on a recording medium in a predetermined data format, and generating a reproduction clock for obtaining a reproduction digital signal, said method comprising:

outputting a loop gain control signal for increasing a phase-locking capacity for a predetermined period from a phase-locking start;

sampling the digital data with a reproduction clock to obtain a digital data signal;

predicting a zero cross position of random data in the digital data signal obtained by said sampling;

detecting phase error information of the random data from an output signal of said predicting and the digital data signal;

detecting a position where the obtained digital data signal crosses a zero level, and outputting a zero cross flag;

detecting a phase error of the digital data signal on the basis of the zero cross flag;

receiving a phase error signal which is an output of said detecting phase error information as an input signal, and receiving a phase error signal which is an output of the said detecting a phase error as an input signal;

converting an output signal of said receiving into an analog signal; and generating the reproduction clock on the basis of the analog signal output by said converting.

* * * * *